(12) United States Patent
Portier et al.

(10) Patent No.: US 9,755,090 B2
(45) Date of Patent: Sep. 5, 2017

(54) QUANTUM DETECTION ELEMENT WITH LOW NOISE AND METHOD FOR MANUFACTURING SUCH A PHOTODETECTION ELEMENT

(71) Applicants: Centre National de la Recherche Scientifique—CNRS, Paris (FR); Office National d'Etudes et de Recherches Aérospatiales—ONERA, Palaiseau (FR)

(72) Inventors: Benjamin Portier, Cachan (FR); Michaël Verdun, Orsay (FR); Riad Haidar, Paris (FR); Jean-Luc Pelouard, Paris (FR); Fabrice Pardo, Vitry-sur-Seine (FR)

(73) Assignees: CENTRE NATIONAL DE LA RECHERCHE SCIENTIFIQUE—CNRS, Paris (FR); Office National d'Etudes et de Recherches Aérospatials—ONERA, Palaiseau (FR)

( * ) Notice: Subject to any disclaimer, the term of this patent is extended or adjusted under 35 U.S.C. 154(b) by 0 days.

(21) Appl. No.: 15/105,753
(22) PCT Filed: Dec. 17, 2014
(86) PCT No.: PCT/EP2014/078329
§ 371 (c)(1),
(2) Date: Jun. 17, 2016
(87) PCT Pub. No.: WO2015/091709
PCT Pub. Date: Jun. 25, 2015

(65) Prior Publication Data
US 2016/0322516 A1 Nov. 3, 2016

(30) Foreign Application Priority Data
Dec. 17, 2013 (FR) ...................................... 1362842

(51) Int. Cl.
*H01L 31/0232* (2014.01)
*H01L 31/0304* (2006.01)
(Continued)

(52) U.S. Cl.
CPC .... *H01L 31/02327* (2013.01); *H01L 31/0304* (2013.01); *H01L 31/03046* (2013.01);
(Continued)

(58) Field of Classification Search
None
See application file for complete search history.

(56) References Cited

U.S. PATENT DOCUMENTS 5,455,421 A   10/1995  Spears
5,818,066 A   10/1998  Duboz
(Continued)

FOREIGN PATENT DOCUMENTS

EP   0807982 A1   11/1997
EP   2477231 A2    7/2012

OTHER PUBLICATIONS

International Search Report issued in corresponding application No. PCT/EP2014/078329 mailed May 6, 2015 (6 pages).
(Continued)

*Primary Examiner* — Jack Chen
(74) *Attorney, Agent, or Firm* — Osha Liang LLP

(57) ABSTRACT

According to one aspect, the invention relates to an element for quantum photodetection of an incident radiation in a spectral band centered around a central wavelength $\lambda_0$, having a front surface intended for receiving said radiation, and including: a stack of layers of semiconductor material forming a PN or PIN junction and including at least one layer made of an absorbent semiconductor material having a cut-off wavelength $\lambda_c > \lambda_0$, the stack of layers of semiconductor material forming a resonant optical cavity; and a structure for coupling the incident radiation with the optical cavity such as to form a resonance at the central wavelength $\lambda_0$ allowing the absorption of more than 80% in the layer of absorbent semiconductor material at said central wave-
(Continued)

length, and an absence of resonance at the radiative wavelength $\lambda_{rad}$, wherein the radiative wavelength $\lambda_{rad}$ is the wavelength for which, at operating temperature, the radiative recombination rate is the highest.

14 Claims, 14 Drawing Sheets

(51) Int. Cl.
    *H01L 31/105* (2006.01)
    *H01L 31/109* (2006.01)
    *H01L 31/0352* (2006.01)

(52) U.S. Cl.
    CPC .... *H01L 31/035209* (2013.01); *H01L 31/105* (2013.01); *H01L 31/109* (2013.01); *Y02E 10/544* (2013.01); *Y02P 70/521* (2015.11)

(56) References Cited

U.S. PATENT DOCUMENTS

| 2013/0228887 | A1 | 9/2013 | Wehner et al. |
| 2016/0322516 | A1* | 11/2016 | Portier .............. H01L 31/02327 |

OTHER PUBLICATIONS

Written Opinion of the International Searching Authority issued in corresponding application No. PCT/EP2014/078329 mailed May 6, 2015 (8 pages).

Collin et al., "Light confinement and absorption in metal-semiconductor-metal nanostructures"; Quantum Dots, Nanoparticles, and Nanoclusters II; Proceedings of SPIE, vol. 5734, pp. 1-12; Apr. 4, 2005 (12 pages).

Duan et al., "Monolithically Integrated Photodetector Array With a Multistep Cavity for Multiwavelength Receiving Applications"; Journal of Lightwave Technology, vol. 27, No. 21, pp. 4697-4702; Nov. 1, 2009 (6 pages).

Tan et al., "Modeling and Performance of Wafer-Fused Resonant-Cavity Enhanced Photodetectors"; IEEE Journal of Quantum Electronics, vol. 31, No. 10, pp. 1863-1875; Oct. 1995 (13 pages).

International Preliminary Report on Patentability issued in corresponding International Patent Application No. PCT/EP2014/078329, dated on Mar. 14, 2016 (19 pages).

International Preliminary Report on Patentability issued in corresponding International Patent Application No. PCT/EP2014/078329, mailed on Mar. 14, 2016 (19 pages).

\* cited by examiner

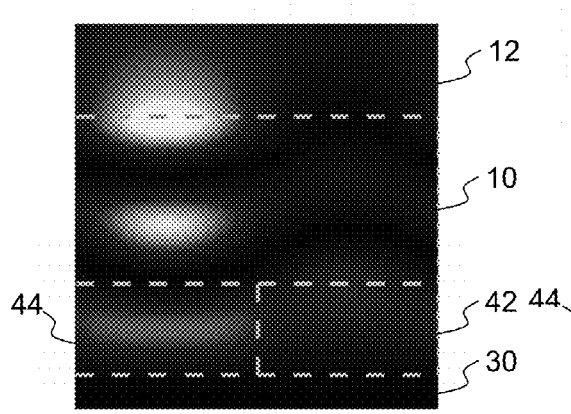
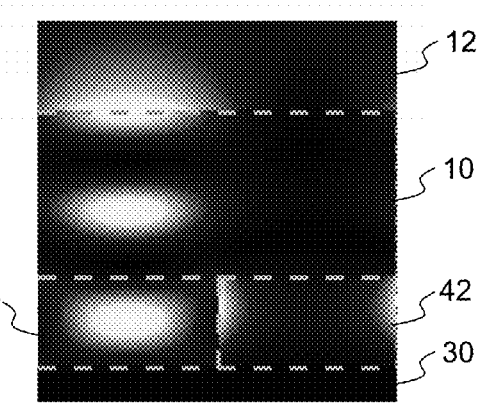
FIG.9A  FIG.9B
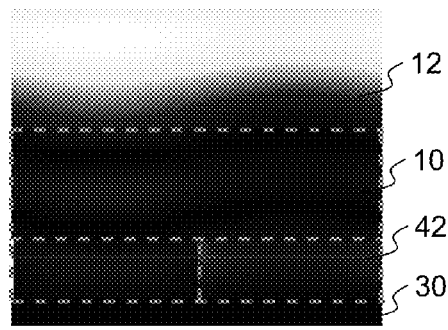
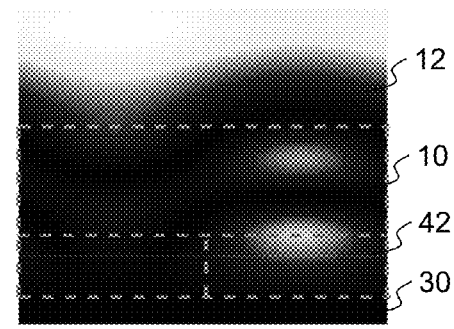
FIG.9C  FIG.9D

QUANTUM DETECTION ELEMENT WITH LOW NOISE AND METHOD FOR MANUFACTURING SUCH A PHOTODETECTION ELEMENT

PRIOR ART

Technical Field of the Invention

The present invention relates to a quantum photodetection element with very low noise and to a method for manufacturing such a photodetection element. The invention applies notably to the design of photodetectors in the infrared having very good sensitivity.

Prior Art

An optical detector converts optical radiation into an electrical signal. This photon-electron conversion may be indirect: in the case of thermal detectors for example, the absorption of light is manifested by a temperature rise of an absorbent material which is thereafter converted into an electrical signal. Photonic (or quantum) detectors involve on the contrary the direct creation of electrical charge which may be either ejected (photoemissive effect) or released within the photosensitive material (case of semi-conducting materials).

Photoresistors and photodiodes feature in particular among semi-conductor detectors. Photoresistors (or LDRs: Light Dependant Resistors) comprise a layer of semi-conducting material; they behave as resistors which allow a larger or smaller electric current to pass as a function of the light illumination. Photodiodes are junction diodes traversed at given electrical bias by an electric current dependent on the light illumination. They comprise for example a doped semi-conductor of type P and a doped semi-conductor of type N which form a junction at their interface (so-called PN junction). The doping of type N is produced by the introduction into the crystal of electron-donating impurities which increase the density of negative charge (electrons). The doping of type P is produced by virtue of electron-accepting impurities which increase the density of positive charge (holes). FIG. 1A shows the energy chart of the electrons in a PN junction. In the vicinity of the junction, there exists a depletion zone (absence of free carriers) also called a space charge zone (SCZ). The photons of greater energy than the energy of the forbidden band of the semi-conductor ("gap"), that is to say of lower wavelength than a so-called cutoff wavelength ($\lambda_c$), are absorbed and induce the passage of an electron from the valence band to the conduction band which is manifested by the occurrence of a pair of additional mobile charges: an electron in the conduction band and a hole in the valence band. In the space charge zone, under the action of the electric field which prevails in this zone, the hole will be accelerated toward the zone of type P and the electron toward the N zone, each of them adding to the majority carriers of these zones. This results in a separation of the electron-hole pair and an electric current flowing in the device from the zone of type N toward the zone of type P, the photo-current, which adds to the reverse current of the diode. This scheme is sometimes improved by the addition between the two zones of a non-intentionally doped layer (loosely speaking termed "Intrinsic") making it possible to increase the thickness of the SCZ so as to render it closer to the absorption length of the photons in the semi-conductor ("PIN" junction).

FIG. 1B shows the current/voltage characteristic of a photodiode illuminated by a luminous flux E that can take several values $E_1$, $E_2$, $E_3$ such that $E_1<E_2<E_3$. The intensity I corresponds to the intensity of the electric current which passes through it as a function of the voltage V across its terminals. As illustrated by FIG. 1B, the feature of a photodiode is that its current/voltage characteristic depends on the luminous flux that it receives. In the absence of illumination, the characteristic is that of a junction diode with in particular a zero current for a zero applied voltage. As the luminous flux increases, an increase is observed in the current toward negative intensities, in particular for negative voltages. In accordance with the conventions chosen for the orientation of I and V, if the product P=I*V is positive, the dipole receives energy and operates as receiver. If the product is negative, the dipole provides energy; it behaves as a generator. The generator quadrant corresponds to the photovoltaic domain.

When the dipole operates as receiver, the device is characterized by its detectivity:

$$D^* \propto \sqrt{\frac{1}{2j_{obs}}}\, \eta_{ext}$$

with $\eta_{ext}$ the quantum yield of the device and $j_{obs}$ the dark current density, the dark current being defined as the electric current of the photodetector in the absence of light illumination. The main sources of dark current are on the one hand intrinsic sources, such as the diffusion current of the minority carriers and the current from radiative and non-radiative generation-recombination of charge, and on the other hand sources related to the manufacturing method, such as the currents from non-radiative recombination on the defects of the semi-conductor (so-called SRH current) which is particularly intense in the vicinity of the surfaces or interfaces.

The diffusion current of the minority carriers is proportional to the gradient of their density, itself imposed by the boundary conditions at the limits of the SCZ on the one hand and of the electrical contact on the other hand. When the electrons or the holes are not uniformly distributed in the semi-conductor, their motion takes place in a direction which tends to make their spatial distribution more uniform. In a PN junction, the distribution of the minority carriers in the doped zones is not uniform, hence a diffusion of these carriers. The resulting current is called the diffusion current.

The article by S. R. Forrest et al. in 1980 (see "In$_{0.53}$Ga$_{0.47}$As photodiodes with dark current limited by generation-recombination and tunneling" Appl. Phys. Lett. 37(3), 1980) demonstrates a large reduction in the diffusion current by means of InP "barrier layers" in heterojunctions of InP/InGaAs type.

FIG. 2 thus describes a quantum detector according to the prior art, comprising a heterojunction 1 of PIN type composed of three layers 14, 10, 12 of semi-conducting material, for example a heterojunction of InP/InGaAs type. The layer 10, for example of InGaAs, situated between the layers 14 and 12, for example of InP, is a layer of semi-conducting material which is absorbent in the spectral band of interest and forms the I zone of the PIN junction. The thickness of the absorbent layer 10 is about 2 µm or more, to absorb the whole of the incident radiation. The layers 14 and 12 situated on either side of the I zone, exhibit forbidden energy bands that are higher than the forbidden energy band of the I zone, thus forming layers termed "barrier layers" which make it possible to greatly limit the diffusion current in the heterojunction, as was demonstrated in S. R. Forrest et al. Zones 16 of type P are obtained by ion diffusion or implantation into the barrier layer 14. Each zone of type P thus defines a pixel of the detector. Passivation layers 6 on the rear face make it possible to limit the effects of the crystallinity defects giving rise to the SRH (Shockley-Read-Hall) current in the space charge zone. A layer of conducting material 3, for example a metallic layer, makes it possible to form an electrical contact at the level of each pixel. Each electrical contact 3 is in contact with a reading circuit 9 via an Indium ball 7. The electrical contact 3 represents for each pixel the anode of the electrical circuit formed by the heterojunction. The cathode of the circuit is formed by an offset contact 5 in electrical contact with the barrier layer 12 and allowing contact with the reading circuit. The barrier layer 12 forming the front face FF intended to receive the incident radiation is covered with an antireflection layer 8 so as to transmit to the heterojunction the maximum of the incident optical flux (represented by arrows in FIG. 2).

It may be shown that in heterojunctions with low diffusion current such as are described in FIG. 2, the generation-recombination current becomes predominant.

There is said to be "generation" when an electron occupying a state in the valence band makes a transition to an unoccupied state of the conduction band. This is a process which occurs spontaneously at non-zero temperature. At thermodynamic equilibrium, the thermal generation is exactly compensated by an antagonistic process, called the "recombination": an electron of the conduction band passes to the valence band. There are several generation-recombination processes in semi-conductors. One customarily distinguishes between radiative and non-radiative processes depending on whether the energy of the electron-hole pair is dissipated by the emission of a photon (radiative) or of phonons (non-radiative). All these generation-recombination phenomena induce a parasitic current in the structure, called the generation-recombination current.

The issue of reduction in the dark current in a heterojunction with low diffusion current is still topical as attested by the article by J. A. Trezza et al. in 2011 (Proceedings SPIE, 8012: 80121Y-80121Y-12, 2011), in which an analysis and an estimation of the dark currents are detailed. It is shown that under reverse bias, the dark current density is proportional to the rate of generation-recombination of charge and to the thickness of the space charge zone, in which the generation-recombination phenomena take place.

Note that the generation-recombination process also exists in photoresistors, at the level of the layer of semi-conducting material, creating a parasitic dark current in the same manner.

To reduce the dark current, it is possible to seek to reduce the recombination-generation rate while keeping the diffusion current low, for example by cooling the detector, this constituting an energy-expensive solution, or by optimizing the electronic structure. It is also possible to seek to reduce the thickness of the space charge zone.

However, a decrease in the thickness of the space charge zone is also manifested by a decrease in the absorption of the detector.

It is known to use optical resonators to concentrate the energy and compensate the decrease in the thickness of the space charge zone, in the domain of infrared detection (see for example patent EP 2 276 072) or in the domain of photovoltaics (see for example Polman. A., & Atwater, H. A. (2012), 'Photonic design principles for ultrahigh-efficiency photovoltaics', Nature materials, 11(3) 174-177). None of these documents however discloses photodetection elements allowing a reduction in the generation-recombination current, in particular within junctions with low diffusion current.

An object of the present invention is to produce a detector having optimized detectivity by virtue of a reduction in the dark current; this objective is achieved by means of an optical resonator whose particular arrangement allows a drastic decrease in the generation-recombination phenomena.

SUMMARY OF THE INVENTION

According to a first aspect, the invention relates to a quantum photodetection element for an incident radiation in a spectral band centered around a central wavelength $\lambda_0$, exhibiting a front face intended to receive said radiation, and comprising:
a stack of layers made of semi-conducting material forming a PN or PIN junction and comprising at least one layer made of an absorbent semi-conducting material with a cutoff wavelength $\lambda_c > \lambda_0$, the stack of layers made of semi-conducting material forming a resonant optical cavity;
a structure for coupling the incident radiation with the optical cavity to form:
a resonance at the central wavelength $\lambda_0$ allowing absorption of greater than 80% in the absorbent semi-conducting material layer at said central wavelength;
an absence of resonance at the radiative wavelength $\lambda_{rad}$, where the radiative wavelength $\lambda_{rad}$ is the wavelength for which, at operating temperature, the rate of radiative recombination is a maximum.

Electrical contacts allow the biasing of the photodetection element.

The wavelength $\lambda_{rad}$, called the radiative wavelength in the present patent application, is the wavelength for which the rate of radiative recombination is a maximum. It satisfies the inequality $\lambda_0 < \lambda_{rad} < \lambda_c$. By ensuring absence of resonance at the radiative wavelength, one ensures a limitation of the absorption of the photodetection element at $\lambda_{rad}$. It is then possible to radically reduce the generation-recombination current, the emissivity varying like the absorption, according to Kirchoffs law. It is also possible to work at a wavelength $\lambda_0$ further from the cutoff wavelength by ensuring reduced absorption at the radiative wavelength, the reduction having to be greater than $\exp(\Delta E/kT)$ where $\Delta E$ is the variation of the energies corresponding to the wavelengths $\lambda_{rad}$ and $\lambda_0$. According to a variant, the structure for coupling the incident radiation with the optical cavity is suitable for producing a minimum of absorption in the absorbent semi-conducting material layer at the radiative wavelength. According to a variant, this minimum of absorption results from an antiresonance in the cavity.

In the structures of the prior art, the cutoff wavelength is generally chosen to be very close to the central wavelength of the spectral detection band so as to limit the rate of radiative recombination and thereby, the dark current. According to the present description, the cutoff wavelength is intentionally chosen with a given disparity of length with the central wavelength of the spectral detection band, the optical cavity exhibiting a non-resonance at the radiative wavelength, the value of which lies strictly between the central wavelength of the spectral detection band and the cutoff wavelength.

Advantageously, according to a variant, the structure for coupling the incident radiation with the optical cavity is suitable for reducing the absorption in the absorbent semi-conducting material layer at the radiative wavelength $\lambda_{rad}$, said reduction being greater than $\exp(\Delta E/kT)$ where $\Delta E$ is the variation of the energies corresponding to the wavelengths $\lambda_{rad}$ and $\lambda_o$. The reduction in the absorption is understood here by comparison with an identical detection element in which there were no coupling structure.

Advantageously, the resonance at the central wavelength of the spectral detection band is located in the layer of absorbent semi-conducting material, making it possible to limit the absorption at the surface and on the interfaces.

Advantageously, the photodetection element comprises a metallic reflective layer arranged on a side of the optical cavity, opposite to the side supporting the front face. According to a variant, the metallic reflective layer also serves as electrical contact for the photodetection element.

Advantageously, the resonant optical cavity is a waveguide and the coupling structure comprises a coupling grating on the front face and/or a coupling grating on the rear face, that is to say on the side of the optical cavity opposite to the side supporting the front face.

The coupling grating(s) may be one- or two-dimensional, formed by an alternation of dielectric/dielectric materials (the dielectric materials exhibiting refractive indices with different real parts) or dielectric/metallic materials. The dielectric material may be an insulator or a semi-conductor.

The coupling grating(s) may be limited to the dimensions of a pixel or be extended over a set of pixels.

In the case where the optical cavity is a waveguide, the resonance at the central wavelength $\lambda_0$ in the absorbent semi-conducting material layer is a guided-mode resonance. Advantageously, the waveguide exhibits an antiresonance at the radiative wavelength $\lambda_{rad}$ in the layer of absorbent semi-conducting material, resulting from destructive interference leading to quasi-zero absorption.

The thickness of the waveguide determines number of resonances in the guide. Advantageously, the thickness of the waveguide lies between $\lambda_0/8n$ and $\lambda_0/n$, advantageously between $\lambda_0/4n$ and $3\lambda_0/4n$, where n is the average value of the real parts of the refractive indices of the layers of semi-conducting material forming the waveguide. By choosing a sufficiently large thickness, one ensures that there is at least one resonance at the sought-after wavelength in the layer of absorbent semi-conducting material. By limiting the thickness, one limits the number of resonances in the layer of absorbent semi-conducting material, thereby making it possible to space the resonance wavelengths and to facilitate the occurrence of a "resonance node" at $\lambda_{rad}$.

According to a variant, the coupling grating or gratings comprise a periodic structure, of period lying between $\lambda_0/n$ and $\lambda_0/n_1$, where $n_1$ is the real part of the refractive index of the medium of incidence of the radiation (for example air). These conditions on the period of the grating or gratings make it possible to limit the number of diffraction orders in the stack of layers forming the waveguide, more precisely to have only the diffraction order 0 in the incident medium and the diffracted orders 0, −1 and +1 in the waveguide, thereby once again making it possible to space the resonance wavelengths. This configuration moreover allows very good angular tolerance of the detection element.

According to a variant, the coupling structure comprises "Metal Dielectric Metal", otherwise called MDM, structures.

According to a variant, the photodetection element comprises a stack of layers made of semi-conducting material forming a heterojunction of PN or PIN type, said stack comprising the layer or layers made of semi-conducting material forming the optical cavity.

Advantageously, the heterojunction comprises barrier layers, allowing a large reduction in the diffusion current.

According to a variant, at least one of the barrier layers is structured on at least one part of its thickness so as to form a grating for coupling with the optical cavity. The applicants have shown that this configuration made it possible to further reduce the dark current on account of the reduction in the active surface area.

According to a variant, the photodetection element according to the first aspect is suitable for detection in one of the bands I, II or III of the infrared.

According to a second aspect, the invention relates to an infrared detector comprising an assemblage of quantum photodetection elements according to the first aspect.

According to a third aspect, the invention relates to methods for manufacturing a quantum detection element according to the first aspect.

According to a variant, the method comprises:
The formation on a substrate of an epitaxied structure, comprising a stack of layers made of semi-conducting material, including at least one layer made of an absorbent semi-conducting material with a cutoff wavelength $\lambda_c > \lambda_0$, and an upper layer made of dielectric material,
The structuring of the upper layer made of dielectric material to form a coupling grating,
The deposition on said coupling grating of a metallic reflective layer,
The removal of the substrate to form the front face of the detection element.

Advantageously, the formation of the epitaxied structure comprises an epitaxy by an organometallic procedure.

BRIEF DESCRIPTION OF THE DRAWINGS

Other advantages and characteristics of the invention will become apparent on reading the description, illustrated by the following figures:

FIGS. 9A, 9B, computed images representing the distribution of the electromagnetic field at the central wavelength of the spectral detection band under TE and TM polarization respectively, in the layers of FIG. 6; and FIGS. 9C, 9D, computed images representing the distribution of the electromagnetic field at the radiative wavelength under TE and TM polarization respectively, in the layers of FIG. 6;

DETAILED DESCRIPTION

In the figures, identical elements are referenced by the same labels. The figures are given by way of illustration and are not necessarily to scale.

Figure 3A:
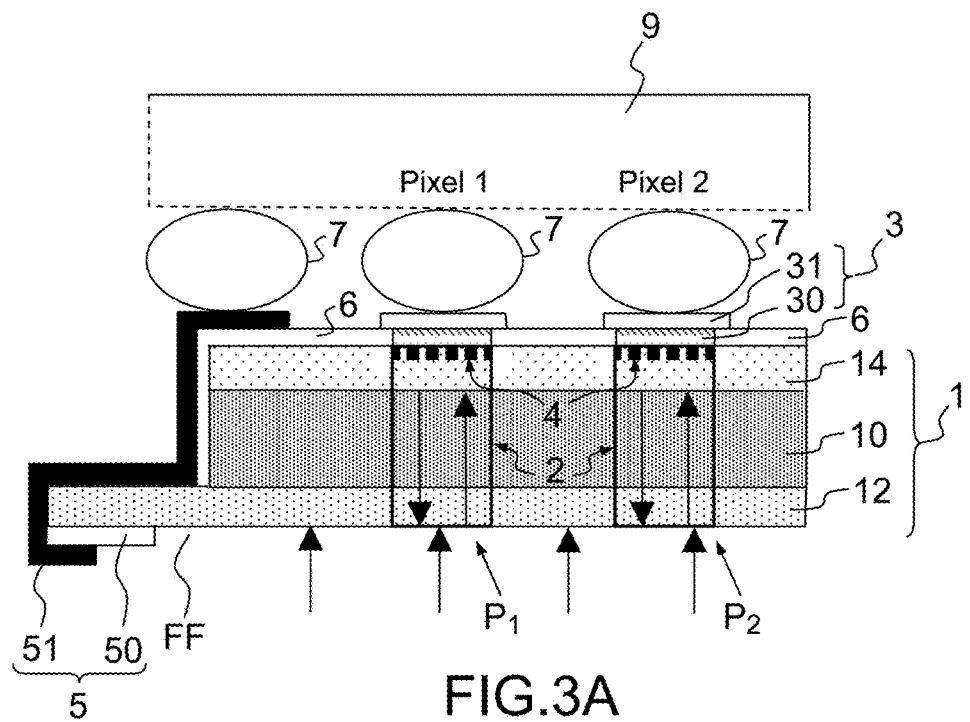
FIGS. 3A and 3B, examples of detectors according to the present description.
Figure 3B:
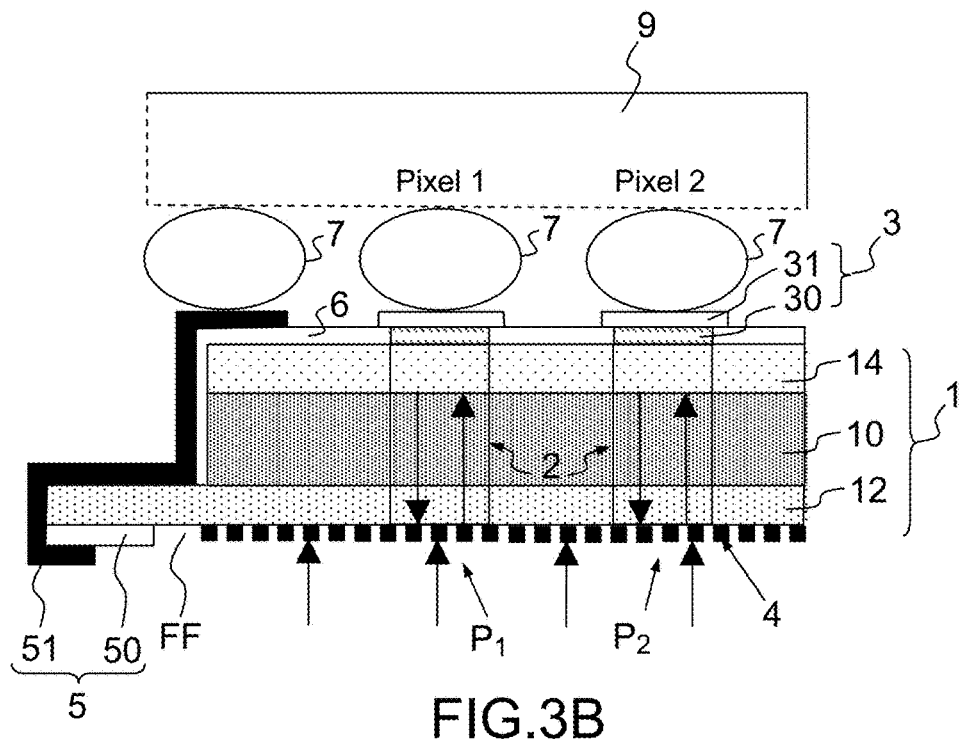

FIGS. 3A and 3B represent two examples of quantum detectors comprising quantum photodetection elements according to the present description.

Figure 1A:
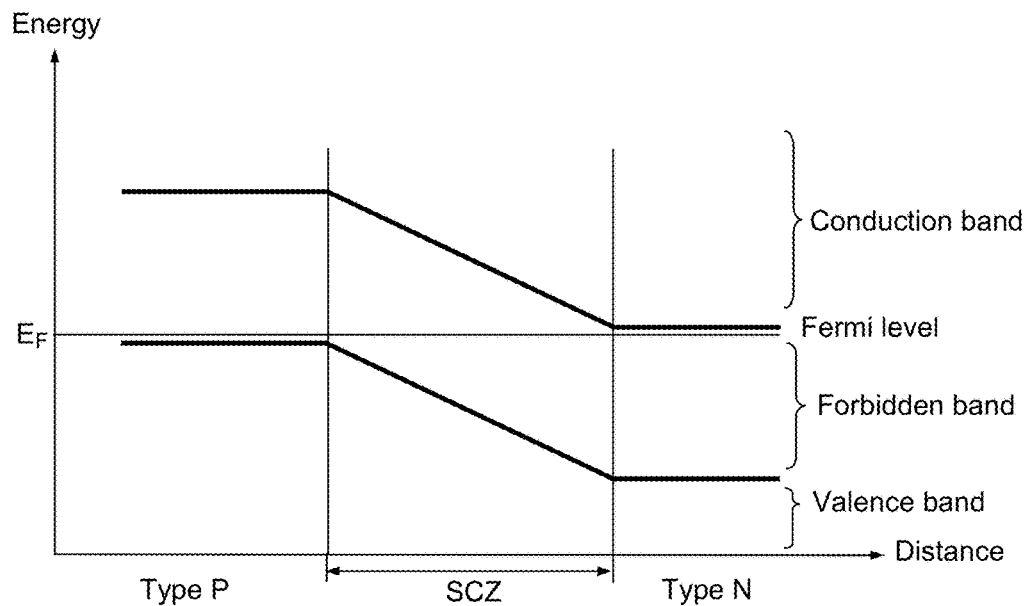
FIGS. 1A and 1B (already described), energy chart of the electrons in a PN junction and current/voltage characteristics of a photodiode as a function of illumination.
Figure 1B:
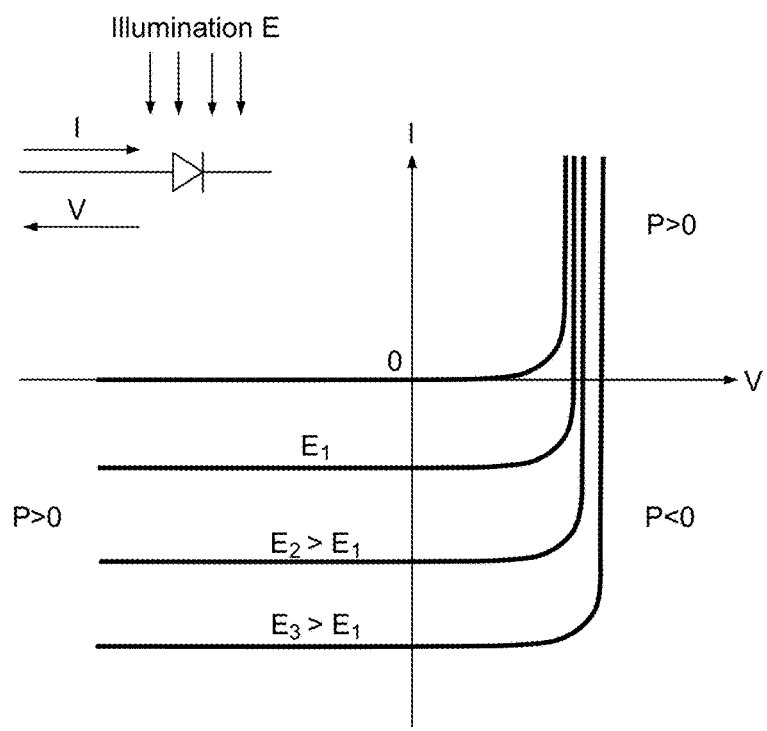
Figure 2:
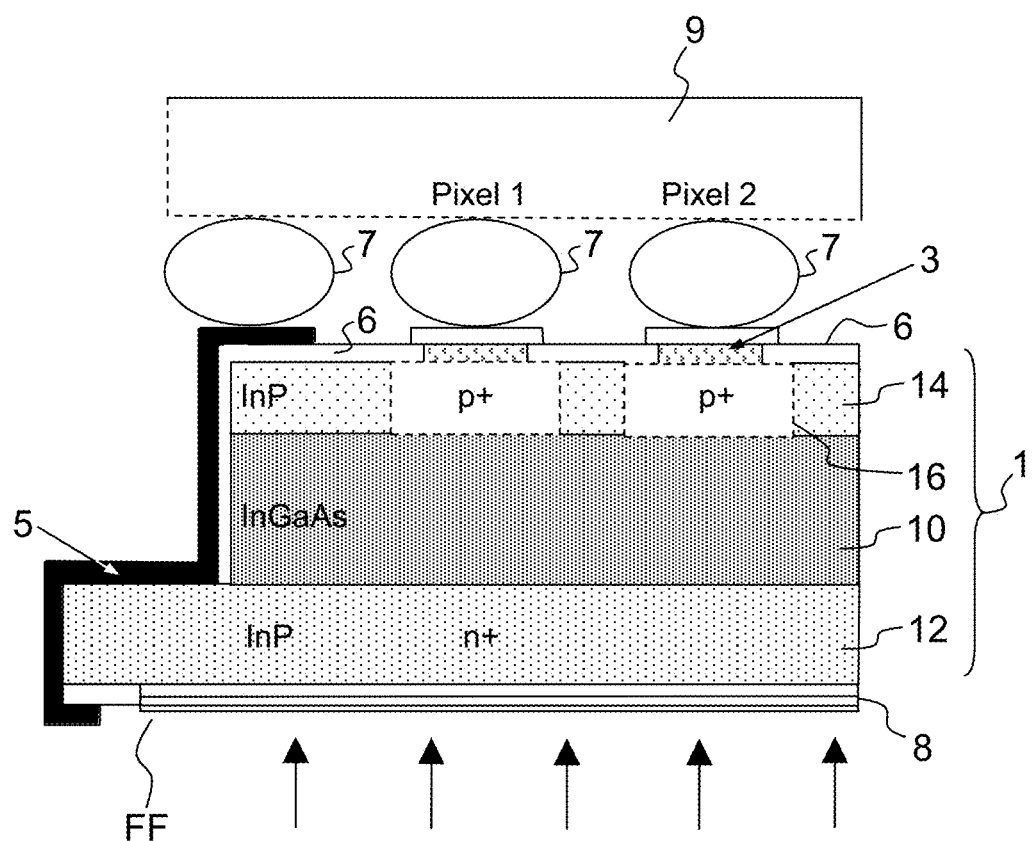
FIG. 2 (already described), example of detector according to the prior art.

As in the example illustrated in FIG. 2, the detector comprises a set of photodetection elements ($P_1$, $P_2$, . . . ), for example arranged in a matrix manner in a focal plane of an imaging optic (not represented). In FIGS. 3A and 3B, the inter-pixel distance is overestimated for the sake of readability of the figures; The photodetection elements are suitable for the detection of an incident radiation in a spectral band centered around a central wavelength $\lambda_0$, for example in one of the bands I, II or III of the infrared, corresponding to the spectral bands of atmospheric transparency. The detector comprises a front face FF intended to receive the luminous radiation indicated by arrows in FIGS. 3A and 3B, as well as a reading circuit 9, arranged on the side opposite to the front face. Each photodetection element comprises a first electrical contact 3 linked to the reading circuit for example by an indium ball 7 to form as many "pixels" of the detector. A second electrical contact 5, common to all the pixels, makes it possible to close the electrical circuit of each of the photodetection elements.

Each photodetection element comprises in these examples a stack of layers made of semi-conducting material forming a junction 1 of PN or PIN type, with in particular a layer 10 of absorbent semi-conducting material of cutoff wavelength $\lambda_c > \lambda_0$. Advantageously, the stack of layers of semi-conducting material forms a heterojunction of PIN type, the layer 10 of absorbent semi-conducting material forming the intentionally undoped so-called Intrinsic zone I. The heterojunction, some examples of which will be described in greater detail subsequently, comprises in these examples other layers of semi-conducting material, including barrier layers 12 and 14, arranged on either side of the layer 10.

The layer 6 can have two complementary roles. On the one hand, it can serve as passivation layer when the SCZ attains the surface of the detector. This is the case for example when the P+ doped zones are produced by ionic local diffusion or implantation of dopants (for example zinc) generating a SCZ at the interface of these zones and of the material of type N. This is also the case when the pixels are insulated by deep etching of a mesa. Moreover, it can serve as protection or encapsulation against attack from the exterior medium. This is particularly useful in the course of the hybridization method but is also useful for reducing the effects of long-term aging of the detector. In the present description, the pixels are advantageously electrically insulated from one another, either by etching all or part of the barrier layer 14 between the pixels, or, as will be described in greater detail subsequently, by diffusion of atomic hydrogen in the barrier layer between the pixels, the effect of which is to render these zones strongly resistive electrically. The SCZ not being in contact with the surface of the device, the manufacturing method is thus facilitated and the related periphery currents of type SRH are reduced with respect to the methods known according to the prior art. The layer 6 can, however, be preserved for its decisive role of protection with regard to the aging of the detector.

In the examples represented in FIGS. 3A and 3B, each photodetection element moreover comprises a metallic reflective layer 30 arranged on a face opposite to the front face FF intended to receive the incident radiation, as well as a coupling structure 4, for example a coupling grating formed of a layer of structured dielectric material. The set of unstructured layers of dielectric material, situated between the reflective layer 30 and the entrance face, are advantageously chosen to exhibit refractive indices whose real parts are close. They form a resonant optical cavity 2, for example a waveguide, of given thickness e. The structure 4 for coupling the incident radiation with the optical cavity, formed in the case of examples 3A and 3B by a coupling grating, is suitable for forming a resonance at the central wavelength $\lambda_0$ corresponding to quasi-total absorption (>80%) localized in the layer 10 of absorbent semi-conducting material and reduced absorption in the layer of absorbent semi-conducting material at a wavelength $\lambda_{rad}$, called the radiative wavelength in the present description, and for which the rate of radiative recombination is a maximum.

The rate of radiative recombination R in the semi-conducting material layer is given by the following relation:

$$R \propto \sqrt{(E-E_g)} e^{-(E-E_g)/kT} \quad (1)$$

where $E=hc/\lambda$ is the energy of the photons emitted at the wavelength $\lambda$ (h Planck's constant and c speed of light), $E_g$ is the forbidden band energy (or gap) of the absorbent semi-conducting material ($E_g = hc/\lambda_c$), k is Boltzmann's constant and T the temperature. Thus, the incident photons energy $E_{rad}$ for which the rate of radiative recombination is a maximum is the energy for which the derivative of equation (1) vanishes, i.e.:

$$E_{rad} = \frac{kT}{2} + E_g \quad (2)$$

This corresponds to a wavelength $\lambda = \lambda_{rad}$, called the "radiative wavelength" in the subsequent description, such that:

$$\frac{1}{\lambda_{rad}} = \frac{1}{\lambda_c} + \frac{kT}{2hc} \quad (3)$$

In practice, one chooses an absorbent semi-conducting material of cutoff wavelength $\lambda_c$ strictly greater than the central wavelength of the spectral detection band sought for the photodetection element. At ambient temperature, the radiative wavelength which is strictly less than the cutoff wavelength while remaining very close, therefore lies in the strict sense between the resonance wavelength of the optical cavity and the cutoff wavelength $\lambda_c$ of the absorbent semi-conducting material.

The applicants have thus shown, as will be described subsequently, a decrease in the generation-recombination current when the reduction in the absorption (therefore in the emission) at $\lambda_{rad}$ is greater than $\exp(\Delta E/kT)$ where $\Delta E$ is the disparity in energy between $\lambda_o$ and $\lambda_{rad}$.

Indeed, a reduction in the absorption-emission at $\lambda_{rad}$ of greater than $\exp(E_o - E_{rad}/kT)$ is manifested by a greater reduction in the dark current than the increase in this current resulting from the reduction in the forbidden bandwidth equal to $E_o - E_{rad}$. On account of the implementation of a resonant optical cavity, the absorbent semi-conducting material layer can be reduced; it can lie for example between a few tens and a few hundreds of nanometers for a layer of InGaAs, making it possible to gain a significant factor as regards the reduction in the thickness with respect to the structures of the prior art. This reduction in thickness is manifested by a reduction in the thickness of the SCZ which leads to a reduction in the same ratio on the one hand of the radiative recombination currents and on the other hand of the non-radiative recombination currents of SRH type. This results in a significant reduction (approximately an order of magnitude) in dark currents.

Moreover, an antireflection layer is no longer necessary on the front face FF; on the contrary, this is sidestepped so as to maximize the reflection at the interface of the dielectric material layer 12 with the incident medium (for example air), so as to generate resonances in the optical cavity.

Advantageously, when the optical cavity is formed of several layers of dielectric material, the real parts of the refractive indices differ by less 20% so as to avoid parasitic reflections at the interfaces.

In the examples of FIGS. 3A and 3B, the reflective layer 30 of metallic material moreover contributes to forming the electrical contact 3 which represents for each pixel the anode of the electrical circuit formed by the heterojunction. The electrical contact 3 allows contact with the indium ball. It comprises moreover, in an optional manner, a layer 31 for the hybridization with the indium ball. As in the example of FIG. 2, the cathode of the circuit is formed by an offset contact 5, the electrical contact 5 comprising for example a layer of conducting material 50 in electrical contact with the barrier layer 12 and a layer of conducting material 51 allowing contact with the reading circuit 9.

As is illustrated in FIG. 3A, the coupling structure can comprise a grating on the rear face. The structuring can be carried out in the metallic layer so as to form the coupling grating or in a layer of semi-conducting material, for example the barrier layer 14. As is illustrated in FIG. 3B, the coupling structure can comprise a coupling grating on the front face. The coupling structure can be obtained by depositing a grating on the layer of semi-conducting material 12, as is illustrated in FIG. 3B, or directly by structuring the layer of semi-conducting material 12. The coupling structure can also comprise a grating on the front face and a grating on the rear face. Other coupling gratings are possible, for example metal dielectric gratings.

Moreover, the coupling grating(s) can be limited to the dimensions of a pixel (FIG. 3A) or be extended over a set of pixels (FIG. 3B).

Figures 4A, 4B, 4C:
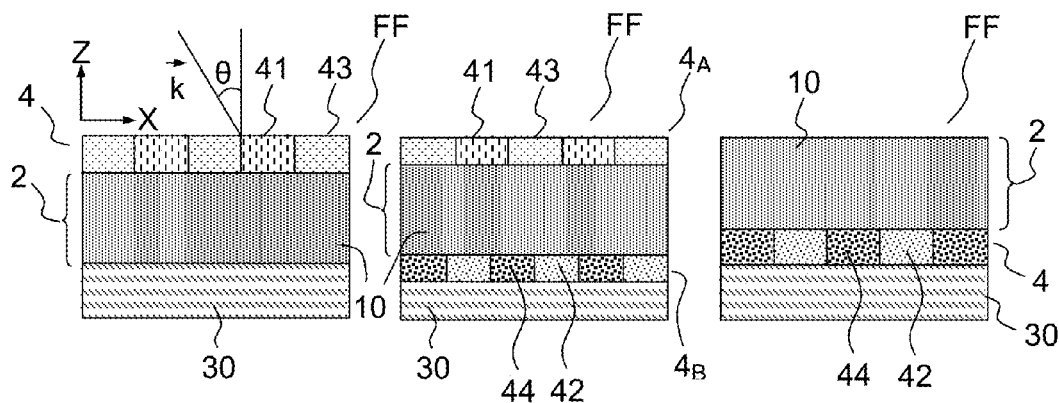
FIGS. 4A to 4C, examples of coupling structures in detection elements according to the present description.
Figure 5A:
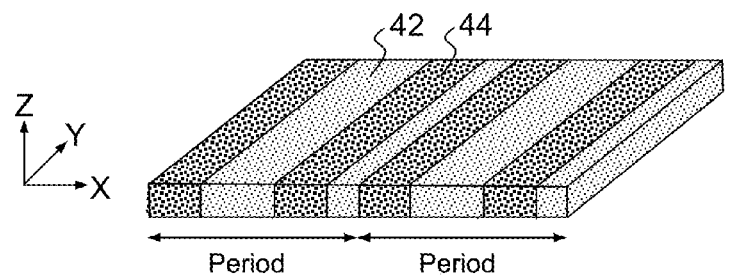
FIGS. 5A to 5E, examples of one- or two-dimensional coupling gratings suitable for a detection element according to the present description.
Figure 5B:
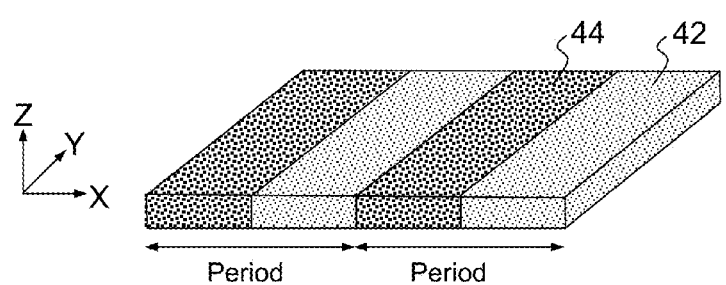
Figure 5C:
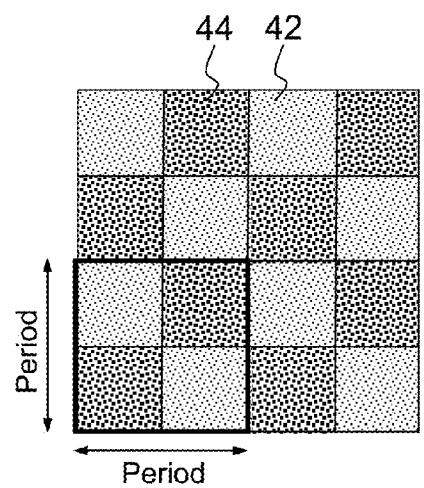
Figure 5D:
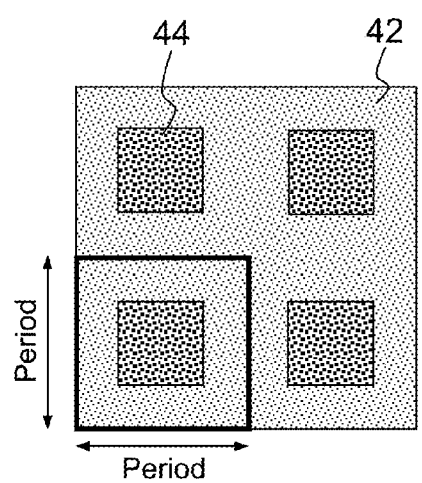
Figure 5E:
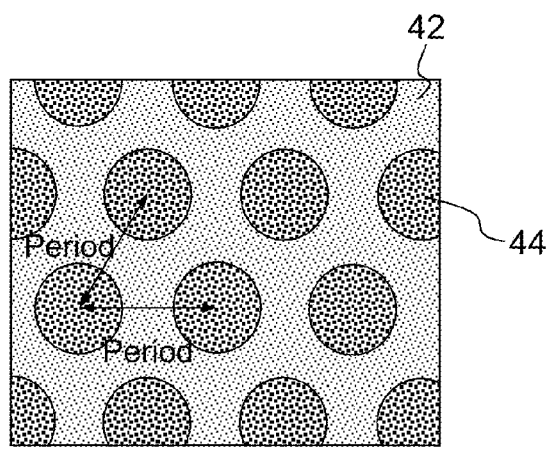

FIGS. 4A to 4C thus illustrate alternative variants of coupling structures suitable for producing a photodetection element according to the present description.

In these figures, for the sake of simplification, the dielectric material layer or layers forming the optical cavity 2 are reduced to just the layer 10. Moreover just the reflective layer 30 is represented, which is in all cases arranged on the rear face.

The example of FIG. 4A shows a coupling structure with a single coupling grating on the front face. The grating 4 is transparent or semi-transparent so as to allow through at least part of the radiation, symbolized in FIG. 4A by the wave vector k. It is for example a grating formed of alternations of two dielectric materials 41 and 43, semi-conducting, or insulating, or air, of different indices. Alternatively, it can be an alternation of a metallic material and of a dielectric material, semi-conducting, insulating or air.

FIG. 4C shows a coupling structure with a single coupling grating on the rear face. The grating 4 consists for example of a grating formed of alternations of two dielectric materials 42, 44, at least one of which is conducting; it can also be an alternation between a metallic or semi-conducting material, and a dielectric material, of semi-conductor or insulator type, or air.

FIG. 4B represents an exemplary coupling structure comprising two gratings $4_A$ and $4_B$ respectively on the front and rear face. As in the example of FIG. 4A, the grating on the front face is transparent or partially transparent. The grating on the rear face comprises at least one conducting material. The plurality of gratings (2 or more) makes it possible in particular to facilitate the generation of antiresonances.

FIGS. 5A to 5E illustrate in the case of coupling gratings, several possible shapes of gratings, in one or two dimensions.

Alternatively to the coupling gratings illustrated by means of FIGS. 3 to 5, the coupling structures can comprise structures of metal-dielectric-metal (MDM) type, such as for example described in patent application FR 2959352. Note that in the latter case, a periodic structuring is not necessary but motivated for technological reasons rather more. Indeed, structures of MDM type act individually as nano-antennas.

Figure 6:
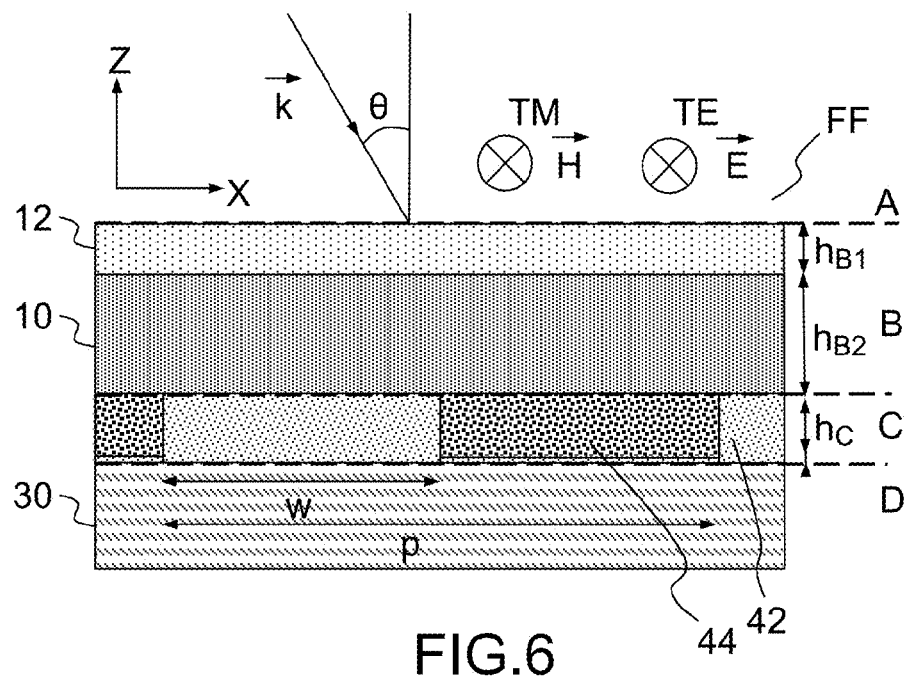
FIG. 6, diagram illustrating the main elements of the optical resonator implemented in a detection element according to an exemplary embodiment, in which the optical resonator forms a waveguide.

FIG. 6 illustrates according to a variant, the optical diagram of a detection element according to the present description implementing an optical cavity of waveguide type with a coupling grating on the rear face. The optical diagram of the detection element thus illustrated comprises a region A corresponding to the medium in which the luminous radiation is incident (for example air), a region B corresponding to the waveguide, a region C corresponding to the coupling grating and a region D corresponding to the metallic mirror.

In a structural manner, the detection element comprises one or more unstructured layers of semi-conducting material 10, 12, of thicknesses $h_{B1}$, $h_{B2}$, forming the waveguide. The set of layers, with close refractive indices, is akin from the optical point of view to a single layer B of given mean index. The detection element furthermore comprises a periodic grating (region C), in one or two dimensions, of thickness $h_C$, constituted for example on the one hand of the same semi-conducting material(s) 44 as the waveguide, and on the other hand of an electrically insulating dielectric material 42. The grating is characterized by a period p and a fill factor w/p. Finally the detection element comprises a reflective layer 30 (region D), advantageously a layer of metallic material serving both as ohmic contact and as optical mirror (for example, gold). The resonances implemented are guided-mode resonances. They take place in the waveguide, and are obtained by virtue of the coupling between the incident wave and the modes of the guide. The coupling is ensured by the periodic grating.

A fine semi-conducting layer surrounded by materials of lower optical index behaves indeed as a waveguide: the wave can propagate according to guided modes, characterized by a phase variation equal to 0 (modulo $2\pi$) after an outward-return journey in the layer (that is to say between the interfaces A/B and B/C). There is resonance when the incident wave is coupled to one of these modes. The incident energy is then stored in this mode (the photons perform several outward-return journeys) thereby increasing the components of the electromagnetic field in the guide and therefore the probability of absorption (proportional to the square of the electric field) of the photons thus trapped. Periodic or non-periodic coupling structures are introduced on one side and/or the other of the guide so as to couple the incident wave to the modes of the waveguide. In the example of FIG. 6, the coupling is carried out by periodically structuring the rear face of the waveguide in such a way that at least one order diffracted by the grating coincides with at least one mode of the guide.

According to a variant, the period is chosen in such a way that only three orders (0, +1 and −1) are diffracted by the grating in the waveguide.

Figure 7:
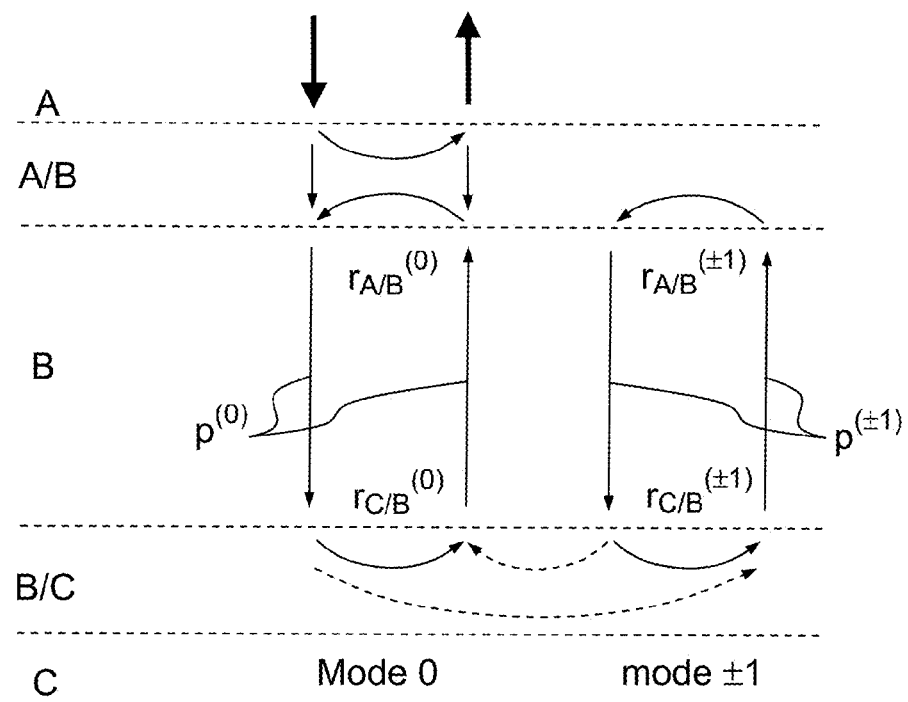
FIG. 7, basic diagram illustrating the propagation paths of the waves in a waveguide of the type of that described in FIG. 6 according to the diffracted orders 0 and ±1 (at normal incidence)

FIG. 7 illustrates the exchanges between the incident wave and the two diffraction modes (mode associated with order 0, and mode associated with the symmetric combination of orders +1 and −1) at normal incidence in the waveguide in the case where the three orders (0, +1 and −1) are diffracted by the grating in the waveguide. In this case, the phase variation associated with an outward-return journey of a diffraction mode in the layer is equal to 0 (modulo $2\pi$), i.e.:

$$\phi(r_{A/B}^{(m)} \exp(2ik_z^{(m)}h) r_{C/B}^{(m)}) = 0 [2\pi],$$

where m is the diffraction mode which interests us, and the terms $r_{A/B}^{(m)}$ and $r_{C/B}^{(m)}$ are the reflection coefficients at the interfaces A/B and B/C of the diffraction mode. In FIG. 7, the resonance is associated with a coupling of mode 0 with modes (+1, −1) of the waveguide. The superposition of the TE and TM resonances is advantageously obtained by adjusting the phase associated with the reflection coefficient $r_{C/B}^{(m)}$ for the two polarizations with the parameters of the grating (period p, fill factor w/p, and thickness $h_C$).

It is thus possible by altering the optical parameters of the structure to obtain an absorption maximum (resonance) at the central wavelength of the spectral band of interest and on the contrary a low absorption, advantageously an absorption minimum (antiresonance) at the radiative wavelength.

Advantageously, it is sought in the optical resonator of the photodetection element according to the present description, to obtain a resonance of Fabry-Pérot type in the waveguide at the central wavelength of the spectral detection band and to laterally confine the electric field at resonance in the waveguide by virtue of the orders +1 and −1 diffracted by the grating.

By definition, the Fabry-Pérot resonance occurs when the phase accumulated by the fundamental mode in the waveguide after an outward-return journey between the two interfaces (A/B and B/C in FIG. 7) is equal to 0 (modulo 2pi). It is characterized by the occurrence of standing waves in the waveguide, with successions of antinodes (field maxima) and nodes (field minimum) in the vertical direction. The objective is to have at least one resonance antinode in the absorbent layer so as to have significant absorption therein, thereby corresponding to a Fabry-Pérot resonance at order 1. At order 0 indeed, there is only one resonance antinode, situated at the air/waveguide interface; at order 1, there is still this resonance antinode, with a further resonance antinode at $\lambda/2n$ from the interface. It is this second antinode that one wishes to have at the level of the active layer.

To achieve this resonator configuration, it is possible to choose a waveguide thickness of the order of $3\lambda_0/4n$, where n is the index of the medium making up the waveguide. For the grating, since orders 0, +1 and −1 are needed, it is then possible to fix the period at mid-way between $\lambda_0/n$ and $\lambda_0$. In this manner, the orders 0, +1 and −1 propagate in the waveguide (since $p > \lambda_0/n$), and the orders +1 and −1 experience total internal reflection at the interface with the air (since $p < \lambda_0$), and will be able to have a significant contribution as regards the distribution of the electric field. For the other parameters of the grating, it is possible to take a fill factor of 50% and a thickness of the order of $\lambda_0/4n$. Under these conditions, the Fabry-Pérot resonance sought under TE or TM polarization is situated at a wavelength close to $\lambda_0$. To identify it, it is possible either to verify that the resonance is independent of the angle of incidence, or to verify that the phase associated with an outward-return journey of the mode 0 in the waveguide is indeed equal to 0 (modulo 2pi) at resonance. Accordingly, it is necessary to study the phase associated with the product $(p^{(0)} r_{B/C}^{(0)} p^{(0)} r_{A/B}^{(0)})$, which corresponds to the order-0 gain after an outward-return journey in the layer, according to the notation of FIG. 7. Once the resonance has been identified for each polarization (TE and TM), the thicknesses of the waveguide and of the grating must be adjusted, together with the period and the fill factor of the grating, so as to superimpose the resonances under TE and TM polarization at $\lambda_0$.

At the conclusion of this step, there is therefore a resonance peak at $\lambda_0$ for each polarization, resulting from the same resonance mechanism. The electric field in the structure is then characterized by a first resonance antinode at the air/waveguide interface, and a second resonance antinode at $\lambda_0/2n$ under the first resonance antinode. The two antinodes are laterally confined in a half-period of the grating, and are situated above the conducting part of the grating (metal or semiconductor). For a conventional Fabry-Pérot resonance where the wave propagates in the cavity in mode 0 only, the electric field is invariant in the horizontal direction (x). The confinement obtained is explained by the presence of an electric field associated with the symmetric combination of the orders +1 and −1 in addition to the electric field associated with mode 0. The sum of these two field terms (constant along x for mode 0, varying as $\cos(2\pi x/p)$ for mode +−1, where p is the period of the grating), gives rise to a field maximum at x=x0 and a field minimum at x=x0+p/2, where x0 is the middle of the semi-conducting part of the grating.

The lateral confinement of the electric field above the conducting parts of the grating makes it possible to further reduce the dark current. Indeed, the applicants have shown that the structuring of the rear face of the heterojunction makes it possible to render electrically inactive the zones situated at the level of the etched parts. It follows from this that these zones do not generate any dark current, i.e. for a fill factor of 50%, a reduction in the total dark current of 50%. However, the photons absorbed in this region do not generate any photocurrent. To preserve a high quantum yield, it is advantageous that all the photons be absorbed in the electrically active parts of the heterojunction. Such is the case for the resonance presented here.

Figure 8:
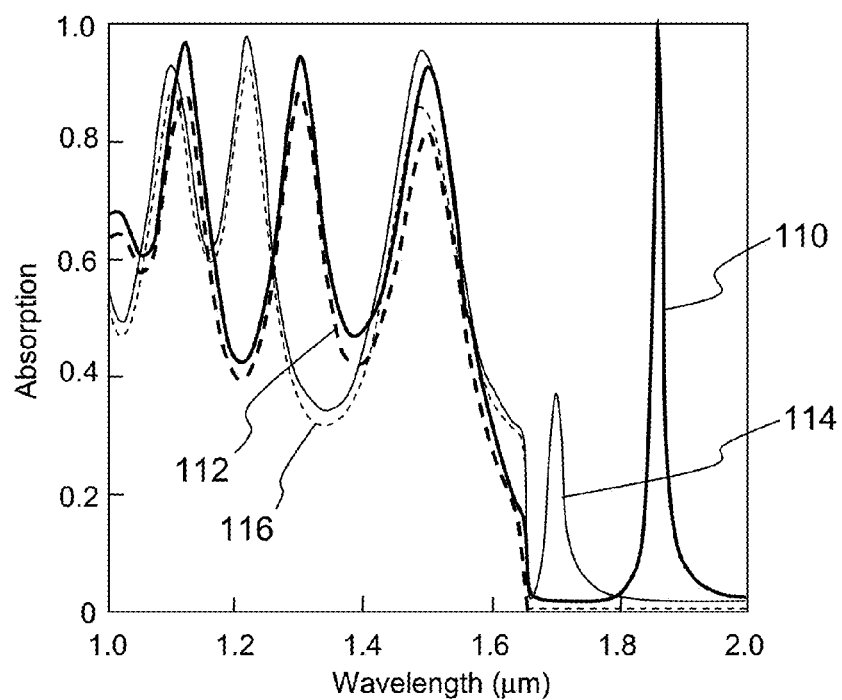
FIG. 8, curves of absorption as a function of wavelength in a detection element implementing a resonator of the type of that described in FIG. 6, in the case of a heterojunction of InP/InGaAs type.

FIGS. 8, 9A and 9B represent respectively the absorption spectrum and the maps of the electric field $|E|^2$ at the resonance wavelength under TE polarization (FIG. 9A) and TM polarization (FIG. 9B), in the various regions A, B, C, D of a photodetection element whose simplified optical diagram is represented in FIGS. 6 and 7. The parameters are optimized for operation of the photodetection element in band I of the infrared, around 1.5 µm, the set of layers of semi-conducting material forming a heterojunction of InGaAs/InP type. More precisely, the numerical simulations are obtained with an electromagnetic simulation code, based for example on the B-Spline modal method (BMM), or the Fourier modal method (FMM). The simulations have been performed taking as value of indices n(InP)=3.2, n(dielectric)=2, n(air)=1. The indices of InGaAs and of gold are computed respectively with the aid of the theoretical formulae given in the articles (Sadao Adachi. Optical dispersion relations for GaP, GaAs, GaSb, InP, InAs, InSb, AlxGa1−xAs, and In1−xGaxAsyP1−y. *Journal of Applied Physics*, 66(12): 6030-6040, 1989) and Aleksandar D. Rakic, Aleksandra B. Djuršic, Jovan M. Elazar, and Marian L. Majewski. Optical properties of metallic films for vertical-cavity optoelectronic devices. *Applied Optics*, 37(22): 5271-5283, 1998.). The other optical parameters of the structure are given in table 1 hereinbelow.

TABLE 1

Dimensions of the layers of the optical structure

| Parameters | Values (nm) |
|---|---|
| $h_{B1}$ | 61 |
| $h_{B2}$ | 315 |
| $h_C$ | 200 |
| w | 400 |
| p | 800 |

The numerical simulations are carried out with the BMM code, based on the B-Spline modal method (see P. Bouchon et al., "Fast modal method for subwavelength gratings based on B-spline formulation", Journal of the Optical Society of America A, 27(4): 696-702, 2010).

The numerical simulations have made it possible to show that this type of structure exhibits, for the TE and TM polarizations, quasi-perfect absorption at λ=1.5 µm and reduced absorption at $\lambda_{rad}$=1.62 µm FIG. 8 represents the total-absorption spectra 110, 114 computed respectively in TM and TE mode for a device having the dimensions as described in table 1 and at normal incidence. Quasi-perfect absorption, stated otherwise a resonance, under TE and under TM, is observed at λ=1.5 µm. In this same figure are represented the absorption spectra 112, 116 computed solely in the semi-conducting material layer 10. The absorption spectra in the optical cavity taken as a whole and the absorption spectra solely in the layer 10 have a similar behavior for wavelengths below 1.6 µm. The semi-conductor layer 10 absorbs and therefore generates the photocurrent. The few differences are due to the losses by absorption in the metallic parts. One thus observes 80% of useful absorption in 315 nm of InGaAs at $\lambda_0$=1.5 µm, corresponding to a gain of 2.5 in detectivity with respect to a non-resonant absorption. In the prior art, the radiation is absorbed on a one-way journey, with 80% of absorption for a semi-conducting layer 2 µm thick. In the device described in the present patent application, the absorption is the same as that obtained in the prior art but the dark current is 6 times smaller; there is a gain by a factor of 2.5 in detectivity.

As described previously, the guided-mode resonances are associated with the occurrence of standing waves, resulting from the combination of counter-propagating waves (horizontal and vertical) in the waveguide. These interferences are characterized by local extrema of the electric field. FIGS. 9A and 9B illustrate for the TE and TM polarizations, the maps of the electric field $|E|^2$ for the resonance observed at 1.5 µm of FIG. 8. The absorption, proportional to $|E|^2$, is efficient only if the semi-conductor exhibits a sufficiently small forbidden bandwidth ($E_g$) ($\lambda<\lambda_c$) where $\lambda_c$=1.24/$E_g$). It is observed in FIGS. 9A and 9B that the two resonance antinodes (in white in the figures) are confined laterally in a half-period of the grating, and are situated above the conducting part of the grating (metal or semiconductor) in the absorbent semi-conducting material layer. FIGS. 9C and 9D illustrate for the TE and TM polarizations, the maps of the electric field $|E|^2$ for the radiative wavelength $\lambda_{rad}$=1.62 µm. An absence of the electric field in the layer of absorbent semi-conducting material is on the contrary observed at the radiative wavelength, resulting from the non-resonance at this wavelength.

Figure 10:
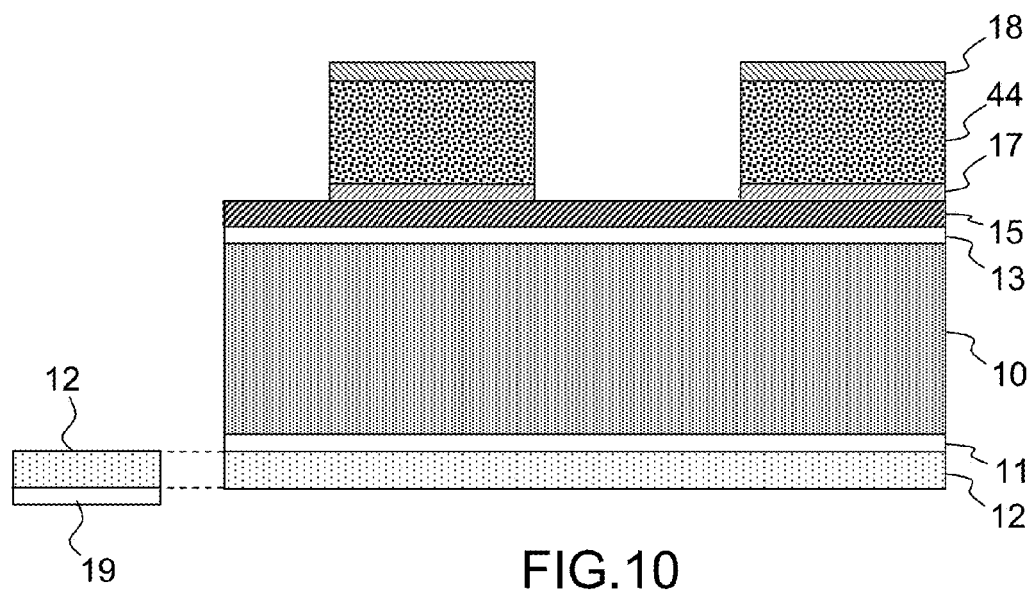
FIG. 10, diagram illustrating in an exemplary detection element according to the present description, a heterojunction of InP/InGaAs type.

FIG. 10 represents a diagram illustrating a particular example of a heterojunction, for example a heterojunction of InP/InGaAs type suitable for detection in band I of the infrared, structured such that one of the barrier layers of the heterojunction has the function of coupling grating in the simplified optical diagram represented for example in FIG. 6.

In this example, more precisely, the heterojunction comprises a zone of type P (set of layers 44, 17, 15, 13), an intrinsic zone I (10) and of a zone of type N (set of layers 11 and 12) to form a PIN junction. The intrinsic zone is an absorbent layer produced with a semi-conductor whose forbidden bandwidth is smaller than the energy of the incident photons. Preferentially the incident wavelength $\lambda_0$ is smaller than the radiative wavelength $\lambda_{rad}$ (see equation (3) above) so as to have a better absorption but also to be able to spectrally differentiate radiative emission and absorption. The intrinsic zone 10 is the active zone of the detection element. For example, the intrinsic zone 10 can be formed of a layer of InGaAs having a forbidden band energy of 0.74 eV for a detection at 0.8 eV. The zones of type P and of type N termed quasi-neutrality zones (QNZs), are composed of strongly doped, respectively P and N, semi-conducting layers. These zones can in particular be formed of several layers, one of which is significantly thicker, forming the body layer, respectively 15 and 44 for the zone of type N and 12 for the zone of type P. The body layer of the QNZ has, preferentially, a more significant forbidden bandwidth than that of the intrinsic zone 10, for example a forbidden bandwidth of greater than $10k_BT$ with $k_B$ Boltzmann's constant and T the temperature of the device, advantageously of InP. The other layers of the doped zones of smaller thicknesses 11, 13 and 17 than the body layers of the QNZs of type N and of type P are formed of the same material as that of the layer of the intrinsic zone, for example layers of InGaAs. The fine layers of InGaAs make it possible, in particular, to obtain good conditions of the electron transport with low contact resistances and better collection of the majority carriers. The doped body layers with a markedly more significant forbidden bandwidth than that of the intrinsic zone make it possible to reduce the diffusion current related to the minority carriers. For example, in the zone of type N, the effect of the InP layer will be to introduce potential barriers at the InGaAs/InP interface both in the valence band and in the conduction band. The potential barrier of the valence band is sufficiently significant to reduce the density of electrons injected into the QNZ. The gradient of the minority carriers in this zone being reduced in the same ratio, this results in a reduction in the diffusion current in the same ratio. The barrier of the conduction band is sufficiently fine for the electrons to be able to pass through tunnel effect, ensuring a thermodynamic equilibrium of the electron populations on either side of this barrier. The majority carriers are therefore efficiently collected while the diffusion of the minority carriers is greatly reduced (by a factor close to: $\exp(\Delta E_g/k_B T)$), the dark current is therefore reduced without impeding the collection of the photo-current. Two electrical contact layers 18 and 19 are present in the structure. These electrical contacts are produced with a semi-conductor with small forbidden bandwidth, made for example of InGaAs, to ensure a low contact resistance. On the light entrance face, the contact 19 is offset to the boundary of the detector or of the matrix of detectors so as not to create any shade for the incident flux of photons and also to facilitate manufacture. On the upper face the contact is structured like the barrier on this side. The P-doped upper layers are structured by an etching over almost their entire thicknesses. A layer 17 placed in the upper barrier has the role of stoppage layer for the etching. It allows control of the manufacturing method. It does not have any effect on the dark current. Table 2 presents an exemplary composition of a semi-conducting hetero structure for a quantum detection element with low noise such as described in the present patent application.

TABLE 2

Example of composition of a semi-conducting hetero structure for a quantum detection element with low noise

| Zone | Reference | Material | Doping (cm-3) | Thickness (nm) |
|---|---|---|---|---|
| P | 18 | InGaAs:C | $1^e 19$ | 20 |
| P | 44 | InP:Be | $3^e 18$ | 170 |
| P | 17 | InGaAs:C | $1^e 19$ | 10 |
| P | 15 | InP:Be | $3^e 18$ | 93 |
| P | 13 | InGaAs:C | $1^e 19$ | 10 |
| I | 10 | InGaAs | — | 70 |
| N | 11 | InGaAs:Si | $5^e 18$ | 10 |
| N | 12 | InP:Si | $3^e 18$ | 204 |
| N | 19 | InGaAs:Si | $5^e 18$ | 10 |

Another source of dark current exists: the surface current due mainly to the non-radiative recombination processes situated at the boundary of the device. They are very greatly reduced in this structure by eliminating any contact of the space charge zone (made mainly of InGaAs) with the free surface of the device. Indeed the structuring of the top part of the device leaves a weakly-doped large-gap semi-conductor layer (here hydrogenated InP) exhibiting a low surface recombination rate (~5000 cm/s).

Moreover the pixels are separated from one another by the same method: etching of the zone of type P down to the stoppage layer made of InGaAs. In a variant it will be possible not to etch the zone of type P and to undertake a diffusion of atomic hydrogen from the surface.

Figure 11:
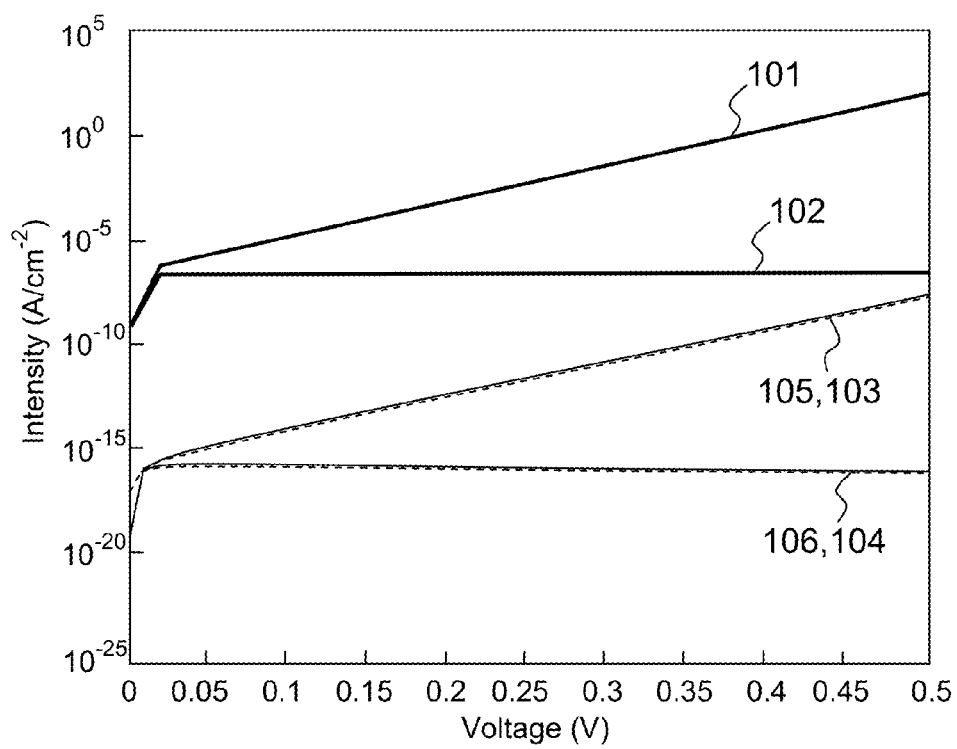
FIG. 11, curves representing the diffusion current in a heterojunction of InP/InGaAs type, compared with the diffusion current in junctions of InP and InGaAs type respectively.

To validate this approach, FIG. 11 represents the current-voltage |I|(|V|) electrical characteristic computed for the structure such as represented in FIG. 10, compared with that of an equivalent InGaAs junction and of an equivalent InP junction (doping levels and thicknesses preserved). In all cases, the radiative recombinations have been artificially eliminated. Curves 101, 102 thus represent the current-voltage characteristics of the InGaAs junction, respectively under forward and reverse bias. Curves 103, 104 represent the current-voltage characteristics of the InP junction, respectively under forward and reverse bias. Curves 105, 106 represent the current-voltage characteristics of the InGaAs/InP heterojunction, respectively under forward and reverse bias. The insertion of the InP barriers "sandwiching" the InGaAs PIN junction actually makes it possible to reduce the diffusion current by nearly 10 orders of magnitude (here $\Delta E_g$=23 $k_B T$). Thus the proposed structure (FIG. 10) exhibits a diffusion current comparable to that of an InP junction while exhibiting the absorption of an InGaAs junction.

Figure 12:
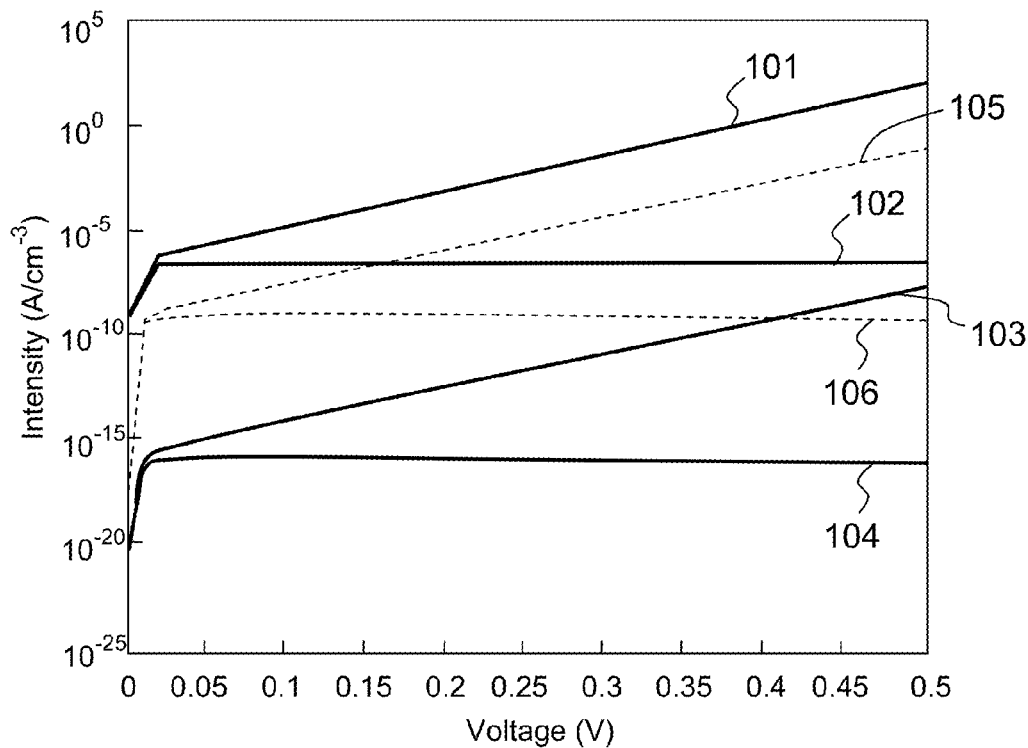
FIG. 12, curves representing the sum of the diffusion current and of the radiative generation-recombination current in a heterojunction of InP/InGaAs type, compared with the diffusion current in junctions of InP and InGaAs type respectively.

FIG. 12 represents the current-voltage electrical characteristics computed for the same structures but this time taking account of the phenomena of radiative recombination. It is observed that the current-voltage characteristics of the InP junction (curves 103, 104) and InGaAs junction (curves 101, 102) are similar to those computed without taking into account the radiative recombinations. In these structures, the diffusion current is dominant. On the other hand, the very large reduction in the diffusion current in the InGaAs/InP heterojunction renders the contribution of the radiative recombination phenomena (curves 105, 106) dominant. The dark current of the InP/InGaAs heterojunction can thus be reduced by about 3 orders of magnitude with respect to that of an InGaAs junction.

Figure 13A:
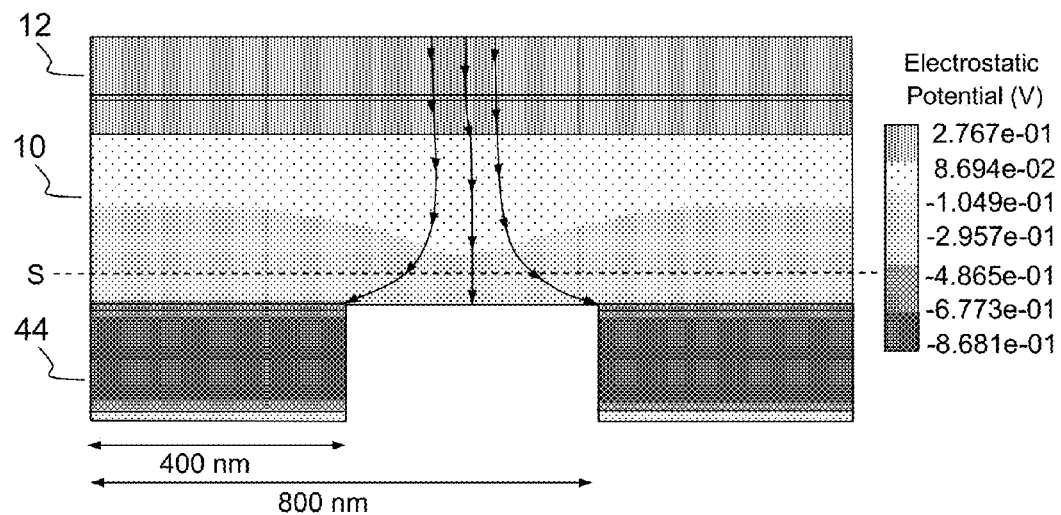
FIGS. 13A and 13B, a diagram showing a mapping of the electrostatic potential in a photodetection element of the type of FIG. 10, and a curve showing the rate of radiative recombination computed under reverse bias as a function of the position in the photodetection element according to a cross section S of FIG. 13A.
Figure 13B:
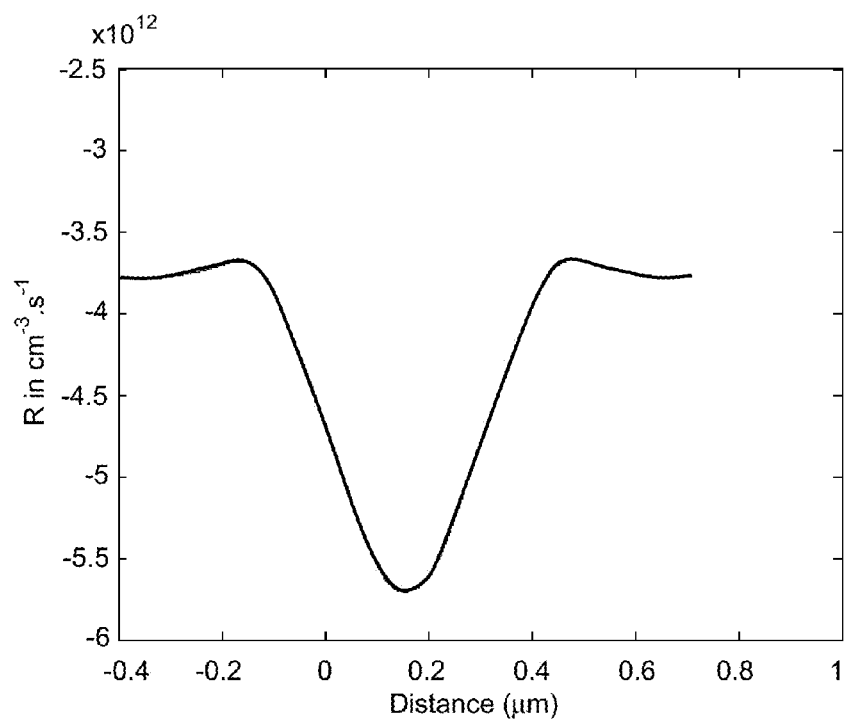

FIGS. 13A and 13B illustrate the effect of the structuring on the radiative generation-recombination phenomena. FIG. 13A presents a mapping of the electrostatic potential under reverse bias (detector operation) in a device similar to that described in FIG. 10, with the parameters described in table 2. The zones of type N (layer 12) have a relatively constant negative potential and the zones of type P (layer 44) have a relatively constant positive potential. In the space charge zone (layer 10), the potential varies. The arrowed lines represent the electric field lines. Under the effect of the strong field which exists at the level of the structured part of the layer 44, the electron hole pairs generated via the intrinsic density are harvested by the semi-conductor pads. FIG. 13B represents the modeling of the rate of radiative recombination R under reverse bias as a function of the position in the device according to the cross section S of FIG. 13A. Under reverse bias, in the situation where there is generation of electrons and holes, the recombination rate is negative. A decrease is observed in the rate of radiative recombination centered around 0.2 μm which corresponds to the region between the semi-conducting pads. The effect of the structuring on the recombination rate is thus observed. By adjusting the structuring of the grating, it is possible to modify the profile of the recombination rate with respect to a flat profile of an unstructured device.

Figure 14:
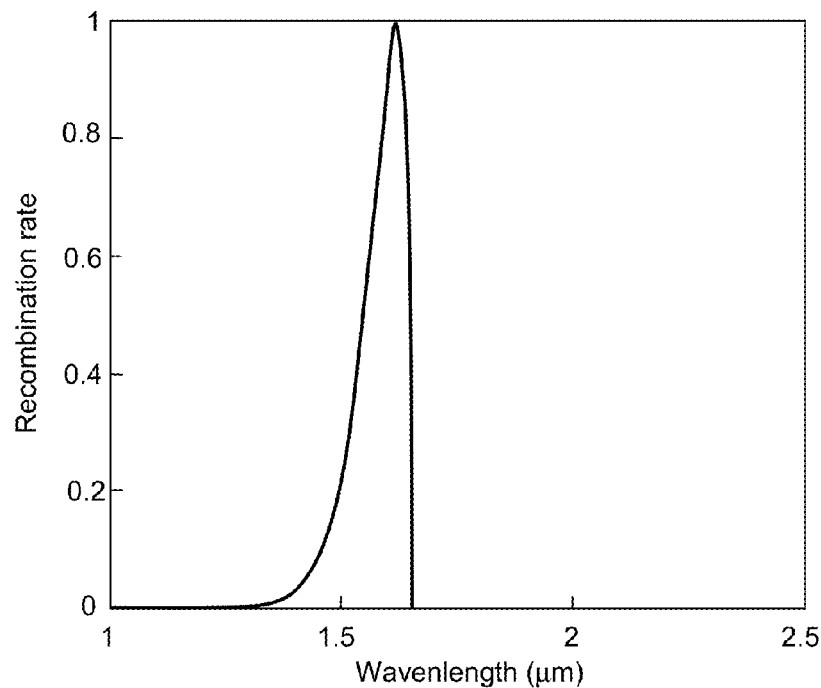
FIG. 14, electroluminescence spectrum determined experimentally in a heterojunction of the type of that represented in FIG. 10.

FIG. 14 illustrates the electroluminescence spectrum computed for a photodiode with InGaAs/InP heterojunction such as represented in FIG. 10, with the parameters given in table 2 and a forward bias of 0.57 V. This spectrum has been measured under large forward voltage to facilitate the experiment. It has been possible to show experimentally that it depends very little on the applied voltage, in particular its maximum remains fixed at the wavelength $\lambda_{rad}$. FIG. 14 thus shows the radiative processes giving rise to the dark current as a function of wavelength (also denoted "luminance of the heterostructure"). The function plotted in this figure is expressed as: $R \propto \sqrt{(E-E_g)} e^{-(E-E_g)/kT}$, $E_g$=0.75 eV, where $E=hc/\lambda$, R the rate of radiative recombination.

The implementation of an optical resonator such as described previously makes it possible to very appreciably decrease the generation-recombination current, related to the radiative recombination effects such as they have been demonstrated in FIGS. 11 to 14.

It is possible on the one hand, by virtue of the optical resonator according to the present description, to reduce the thickness of the I zone (active layer of absorbent semi-conducting material). The corresponding component of the dark current density is then reduced in the ratio of the thickness reduction. That so, the quantum efficiency of the detector is also reduced. The thickness of the I zone is advantageously reduced to a compromise value between these two antagonistic effects. On the other hand, a limit value exists, about 50 nm for InGaAs, below which the contribution of the component of current through the band to band tunnel effect generates an increase in the dark current. By reducing the thickness of the InGaAs layer to 50 nm instead of the 300 nm of the structure previously described, while retaining a constant thickness of the epitaxied layers by increasing the thickness of the InP barrier layers, a reduction by a factor of 6 is obtained in the dark current density.

Moreover, the dimensioning of the optical resonator (parameters of the cavity and of the coupling structure) is suitable for obtaining, at the wavelength $\lambda_{rad}$ for which the rate of radiative recombination is a maximum (see equation 2 above), reduced coupling with free space so as to increase the lifetime of the carriers in this zone. This therefore advantageously entails placing the detection device within an optical resonator exhibiting a resonance at the detection wavelength $\lambda_0$ (maximum coupling with free space) and an antiresonance (minimum coupling with free space) at the emission length $\lambda_{rad}$. The reduction in the absorption at $\lambda_{rad}$ thus produced is in particular, in order to be useful, greater than $\exp(\Delta E/kT)$ where $\Delta E$ is the disparity in energy between $\lambda_{rad}$ and $\lambda_o$.

Figure 15:
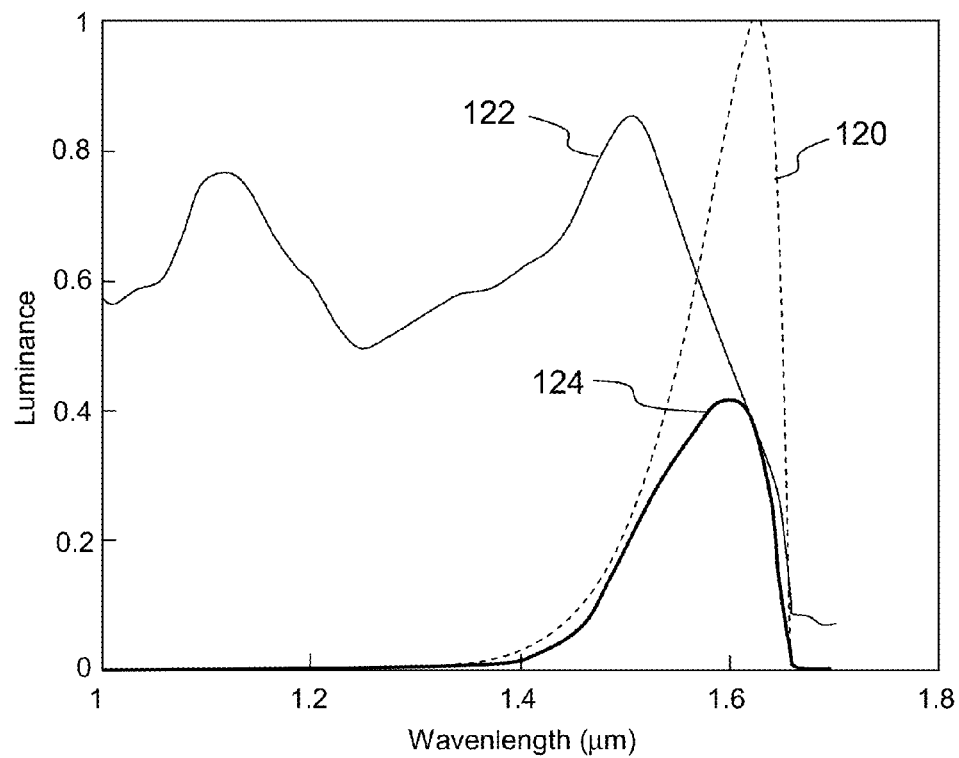
FIG. 15, curves showing respectively the absorption spectrum of the optical cavity formed by the structure represented in FIG. 10, the electroluminescence spectrum of the heterojunction, the luminance of the cavity resulting from the product of the absorption spectrum and electroluminescence spectrum.
Figure 16A:
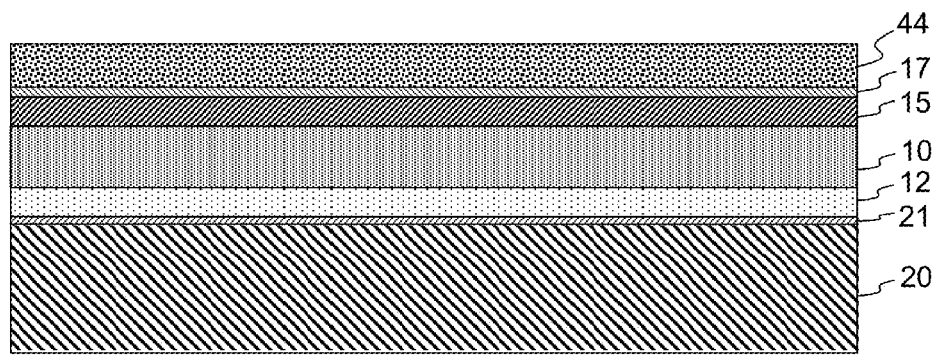
FIGS. 16A to 16G, diagrams representing different steps of an exemplary method according to the present description.
Figure 16B:
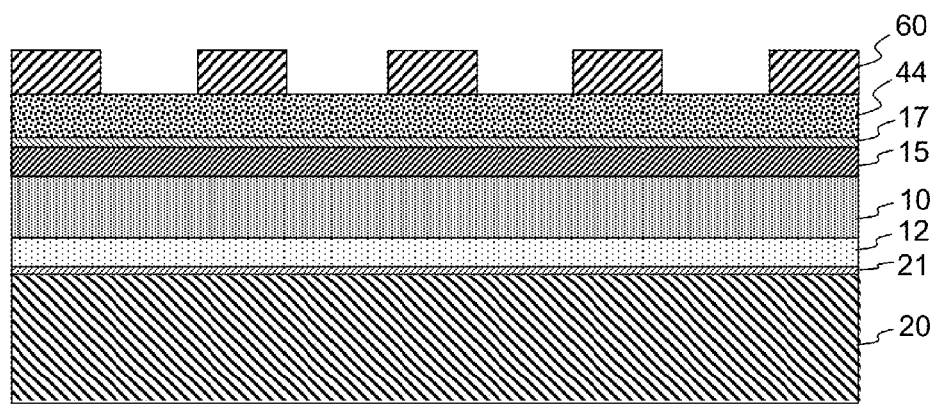
Figure 16C:
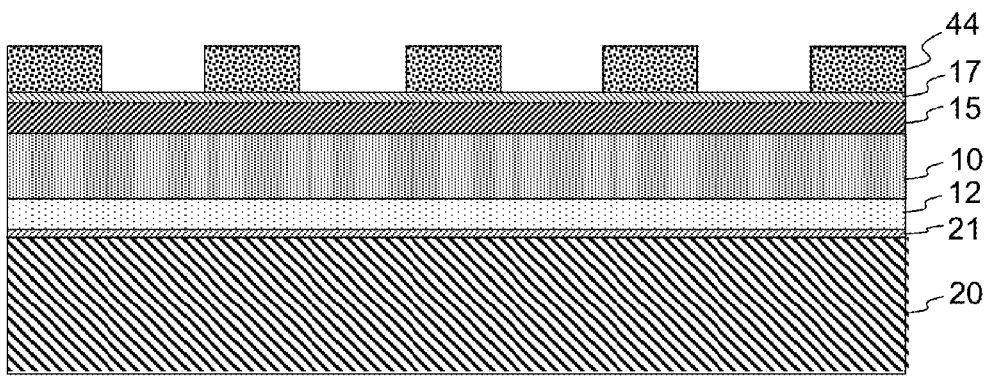
Figure 16D:
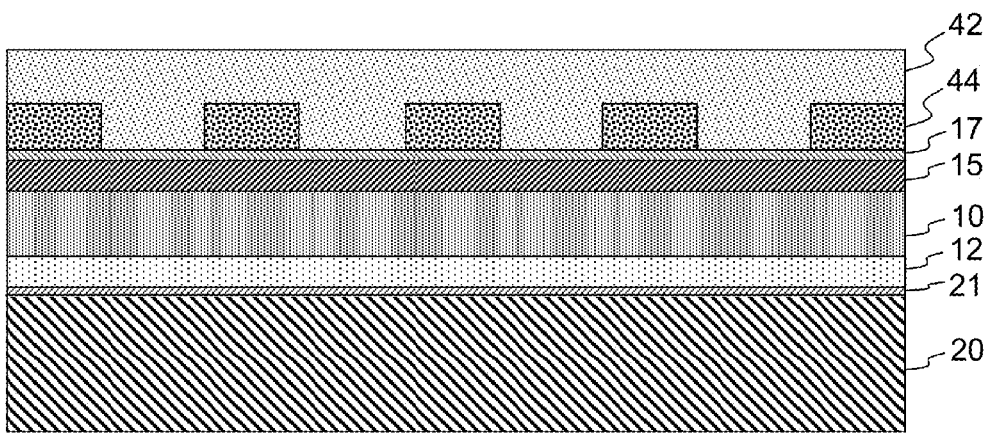
Figure 16E:
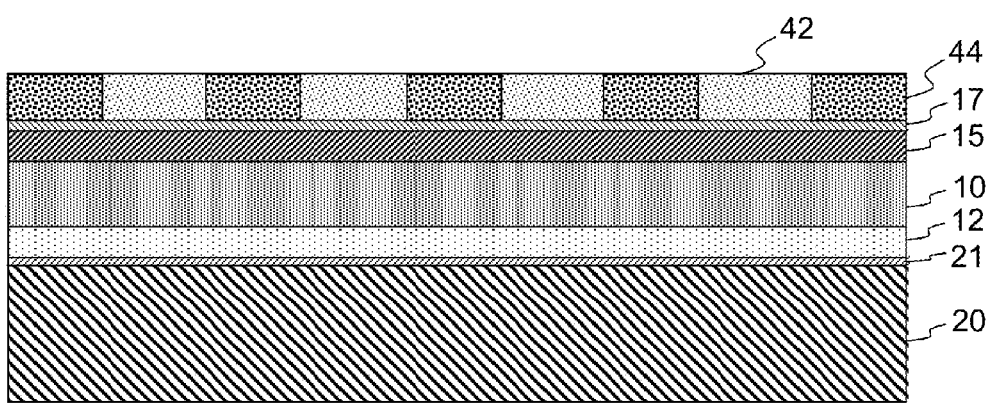
Figure 16F:
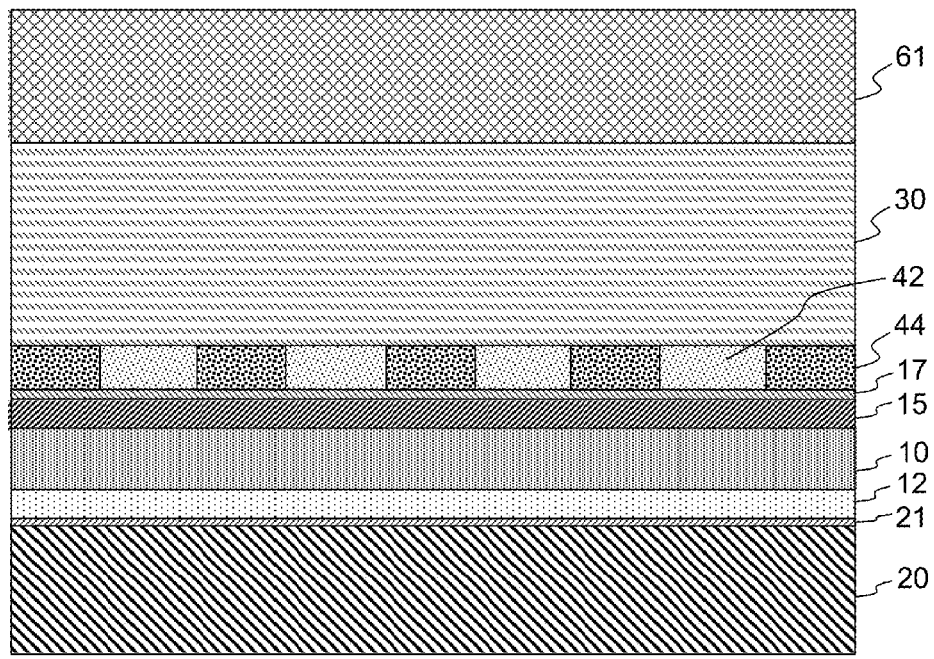
Figure 16G:
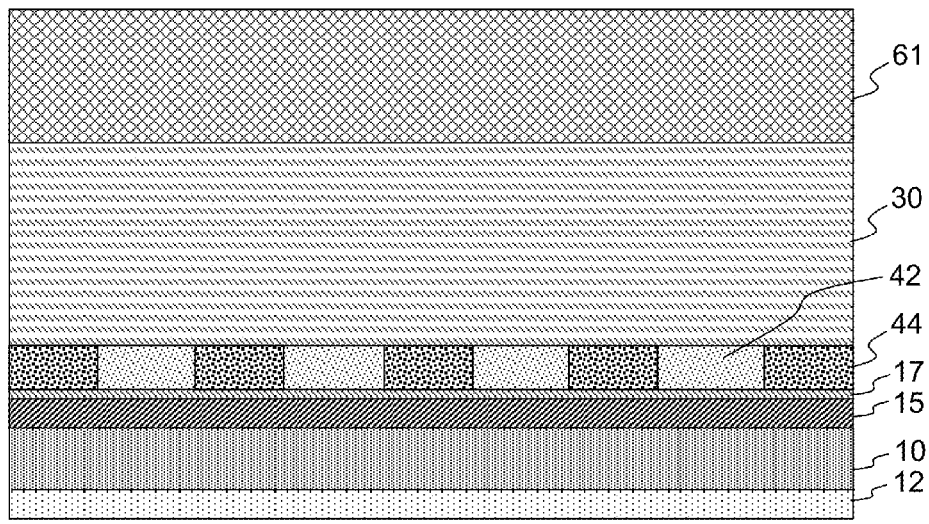

FIG. 15 represents as a function of wavelength, the absorption of the cavity averaged over all the angles of incidence (curve 122), the luminance of the heterojunction (curve 120) and the luminance resulting from the cavity, obtained by multiplying the two spectra. The effect sought by the optical resonator implemented in the present description is indeed observed, namely a maximum of absorption at the central wavelength of the spectral band of interest (here $\lambda_0$=1.5 mm) and reduced absorption at the radiative wavelength.

FIGS. 16A to 16G illustrate an exemplary embodiment for the manufacture of a detection element according to the present description, suitable for example for layers of monocrystalline semi-conducting material.

In a first step (FIG. 16A), a stack of layers 21, 12, 10, 15, 17 and 44 made of semi-conducting material (for example, alternatively GaInAs and InP) is produced by epitaxy on a suitable substrate 20 (made for example of InP). A first stoppage layer 21 (made for example of InGaAs) is epitaxied on the InP substrate. The layers 15, 10 and 19 are suitable for the production of the detector element sought. This entails respectively an N-doped InP layer 15, an intrinsic layer 10 and a P-doped layer 19 to form a PIN junction. The Intrinsic zone can typically have dimensions of 70 nm. The N doping layer 19 can typically have dimensions of 200 nm with a carbon doping of typically $3\times10^{18}$ cm$^{-3}$. The N doping layer 15 can typically have dimensions of 200 nm with a silicon doping of typically $3\times10^{18}$ cm$^{-3}$. In a second step (FIG. 16B), there is undertaken the creation of a mask 60 by lithography on the InP layer 44. This mask makes it possible in particular to define the shape of the coupling gratings. In a third step (FIG. 16C), the InP layer is etched by reactive ion etching and by wet etching. The layer of InGaAs then serves as stoppage layer for the etching. Next, there is undertaken the removal of the mask. In a fourth step (FIG. 16D), there is undertaken the spin coating of the planarizing resin 42 (dielectric). In a fifth step (FIG. 16E), there is undertaken a reactive ion etching of the dielectric until flush. In a sixth step (FIG. 16F), there is undertaken the deposition of a metallic layer 30 made of Au. In a seventh step the sample is transferred onto a host substrate by a bonding method (epoxy, anodic bonding . . . ). Finally, in an eighth step, there is undertaken the removal of the substrate 2 down to the stoppage layer 21 and then removal of the latter by a wet procedure. In order to protect the device against exterior attack (hybridization, atmosphere over the long-term) and to reduce the effects of aging, it is possible to undertake a last step of encapsulation by depositing a resin outside of the metallized zones.

The monocrystalline semi-conducting material layers epitaxied as described in the method hereinabove can comprise for example layers of gallium arsenide (GaAs) and the associated alloys (for example aluminum gallium arsenide AlGaAs), layers of indium phosphide InP and the associated alloys (for example indium gallium arsenide InGaAs), layers of gallium antimonide (GaSb) and of indium arsenide (InAs), in particular a super-grating of InAs/GaSb and the associated alloys (for example aluminum gallium antimonide AlGaSb), layers of silicon (Si).

The same method can be applied for the production of other heterojunctions suitable for detection in other spectral bands. For example:

InAlAs/InGaAs at $\lambda\approx 1.5$ µm;
AlGaAs/GaAs at $\lambda\approx 0.9$ µm;
GaInP/GaAs at $\lambda\approx 0.9$ µm;
[SR InAs/AlSb]/[SR InAs/GaSb] in the 3-5 µm band;
HgCdTe/HgCdTe in the 3-5 µm and 8-12 µm bands;
InP and InAlAs/GaAsSb at $\lambda\approx 1.5$ µm.

Although described mainly within the framework of detectors in the infrared, the invention applies in the same manner to detection in the visible, in particular for photovoltaic applications. The photodetection elements suitable for the production of a device are substantially the same as those described for detection, but they are forward biased. Indeed, the efficiency of conversion of solar energy into electrical energy is limited by several factors, including radiative recombinations of photocarriers. According to the article (Polman, A., & Atwater, H. A. (2012). Photonic design principles for ultrahigh-efficiency photovoltaics. *Nature materials,* 11(3), 174-177), a gain of about 7% in the efficiency of solar cells would thus be achieved by eliminating these recombinations.

Although described through a certain number of detailed exemplary embodiments, the quantum detection element and the method for manufacturing said element comprise alternative variants, modifications and enhancements which will be obviously apparent to the person skilled in the art.

The invention claimed is:

1. A quantum photodetection element for an incident radiation in a spectral band centered around a central wavelength $\lambda_0$, exhibiting a front face intended to receive said radiation, and comprising:

a stack of layers made of semi-conducting material forming a PN or PIN junction and comprising at least one layer made of an absorbent semi-conducting material with a cutoff wavelength $\lambda_c > \lambda_0$, the stack of layers made of semi-conducting material forming a resonant optical cavity, the resonant optical cavity being a waveguide;

a structure for coupling the incident radiation with the optical cavity comprising a diffraction grating on a front face and/or a rear face define as on a side of the optical cavity opposite to a side supporting the front face, to form:

a guided-mode resonance at the central wavelength $\lambda_0$ allowing absorption of greater than 80% in the absorbent semi-conducting material layer at said central wavelength;

a minimum of absorbtion at the radiative wavelength $\lambda_{rad}$, where the radiative wavelength $\lambda_{rad}$ is the wavelength for which, at operating temperature, the rate of radiative recombination is a maximum.

2. The photodetection element as claimed in claim 1, in which the resonance at the central wavelength $\lambda_0$ is located in the absorbent semi-conducting material layer.

3. The photodetection element as claimed in claim 1, in which the structure for coupling the incident radiation with the optical cavity is suitable for reducing the absorption in the absorbent semi-conducting material layer at the radiative wavelength $\lambda_{rad}$, said reduction being greater than $\exp(\Delta E/kT)$ where $\Delta E$ is the variation of the energies corresponding to the wavelengths $\lambda_{rad}$ and $\lambda_o$.

4. The photodetection element as claimed in claim 1, in which and the coupling structure comprises a diffraction grating on the rear face, that is to say on a side of the optical cavity, opposite to the side supporting the front face.

5. The photodetection element as claimed in claim 1, in which the thickness of the waveguide lies between $\lambda_0/8n$ and $\lambda_0/n$, advantageously between $\lambda_0/4n$ and $3\lambda_0/4n$, where n is the average value of the real parts of the refractive indices of the layer or layers made of semi-conducting material forming the waveguide.

6. The photodetection element as claimed in claim 1, in which the coupling grating or gratings comprise a periodic structure, of period lying between $\lambda_0/n$ and $\lambda_0/n_1$, where n is the average value of the real parts of the refractive indices of the layer or layers made of semi-conducting material forming the waveguide and $n_1$ is the real part of the refractive index of the medium of incidence of the radiation.

7. The photodetection element as claimed in claim 1, further comprising a metallic reflective layer arranged on a side of the optical cavity, opposite to the side supporting the front face.

8. The photodetection element as claimed in claim 1, further comprising a stack of layers made of semi-conducting material forming a heterojunction of PN or PIN type, said stack comprising the layer or layers made of semi-conducting material forming the optical cavity.

9. The photodetection element as claimed in claim 8, in which the heterojunction comprises barrier layers.

10. The photodetection element as claimed in claim 9, in which at least one of the barrier layers is structured on at least one part of its thickness so as to form a diffraction grating for coupling with the optical cavity.

11. The photodetection element as claimed in claim 1, suitable for detection in one of bands I, II or III of the infrared.

12. An infrared detector comprising an assemblage of quantum photodetection elements as claimed in claim 1.

13. A method for manufacturing a quantum detection element as claimed in claim 1, comprising:

formation on a substrate of an epitaxied structure, comprising a stack of layers made of semi-conducting material, including at least one layer made of an absorbent semi-conducting material with a cutoff wavelength $\lambda_c > \lambda_0$, and an upper layer made of dielectric material;

structuring of the upper layer made of dielectric material to form a diffraction grating for coupling with the optical cavity;

deposition on said diffraction grating of a metallic reflective layer; and removal of the substrate to form the front face of the detection element.

14. The manufacturing method as claimed in claim 13, in which the formation of the epitaxied structure comprises an epitaxy by an organometallic procedure.

* * * * *